US012684815B2

(12) United States Patent
Chang et al.

(10) Patent No.: US 12,684,815 B2
(45) Date of Patent: Jul. 14, 2026

(54) DEVICE HAVING EXTENDED SOURCE/DRAIN CONTACT AND METHOD

(71) Applicant: Taiwan Semiconductor Manufacturing Co., Ltd., Hsinchu (TW)

(72) Inventors: Chih-Hao Chang, Hsinchu (TW); Wei-Yang Lee, Hsinchu (TW); Kuan-Hao Cheng, Hsinchu (TW); Cheng-Yi Peng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 377 days.

(21) Appl. No.: 18/361,051

(22) Filed: Jul. 28, 2023

(65) Prior Publication Data

US 2025/0040183 A1     Jan. 30, 2025

(51) Int. Cl.
H10D 30/67          (2025.01)
H10D 30/01          (2025.01)
(Continued)

(52) U.S. Cl.
CPC ....... H10D 30/6729 (2025.01); H10D 30/014 (2025.01); H10D 30/43 (2025.01);
(Continued)

(58) Field of Classification Search
CPC .. H10D 30/019; H10D 30/501; H10D 62/118; H10D 62/119; H10D 62/121; H10D 84/832; H10D 62/116; H10D 30/6735
See application file for complete search history.

(56) References Cited

U.S. PATENT DOCUMENTS 10,170,638 B1 *  1/2019  Reznicek ........... H10D 30/6757
11,211,456 B2 *  12/2021  Jung ................... H10D 84/0133
(Continued)

FOREIGN PATENT DOCUMENTS

TW            202243122 A    11/2022
WO      WO 2018237106 A1    12/2018

*Primary Examiner* — Mary A Wilczewski
(74) *Attorney, Agent, or Firm* — Seed Intellectual Property Law Group LLP

(57)          ABSTRACT

A method includes: forming a stack of semiconductor nanostructures on a semiconductor fin; forming a source/drain opening adjacent the stack; forming a bottom dielectric layer on the semiconductor fin; forming a source/drain region in the source/drain opening, a void being present between the source/drain region and the bottom dielectric layer; forming a dielectric layer on the source/drain region; forming a hardened portion of the dielectric layer by treating the dielectric layer, the hardened portion having higher etch selectivity than other portions of the dielectric layer; removing the other portions of the dielectric layer, exposing the void; forming a source/drain contact opening that extends to and connects with the void, the source/drain contact opening exposing sidewalls of the source/drain region; forming a liner layer on exposed surfaces of the source/drain region; and forming a conductive core layer on the liner layer, the conductive core layer being in contact with the liner layer on a top surface, sidewalls and a bottom surface of the source/drain region.

20 Claims, 26 Drawing Sheets

(51) Int. Cl.

| | |
|---|---|
| *H10D 30/43* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 84/85* | (2025.01) |

(52) U.S. Cl.

CPC ..... *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/038* (2025.01); *H10D 84/85* (2025.01)

(56) References Cited

U.S. PATENT DOCUMENTS

| | | | | |
|---|---|---|---|---|
| 11,296,226 | B2 * | 4/2022 | Song | H10D 84/0186 |
| 11,545,556 | B2 * | 1/2023 | Wu | H10D 30/6735 |
| 11,923,363 | B2 * | 3/2024 | Frougier | H10D 88/00 |
| 12,237,230 | B2 * | 2/2025 | Lai | H10D 64/017 |
| 12,356,680 | B2 * | 7/2025 | Zhou | H10D 30/014 |
| 2016/0071945 | A1 * | 3/2016 | Wang | H10D 30/6735 |
| | | | | 438/151 |
| 2018/0190829 | A1 * | 7/2018 | Song | H10D 30/6713 |
| 2018/0301564 | A1 * | 10/2018 | Kwon | H10D 30/6713 |
| 2019/0088789 | A1 * | 3/2019 | Song | H10D 30/6713 |
| 2019/0123161 | A1 | 4/2019 | Yeo et al. | |
| 2020/0044023 | A1 * | 2/2020 | Reznicek | H10D 62/121 |
| 2020/0098876 | A1 | 3/2020 | Lee et al. | |
| 2020/0365692 | A1 * | 11/2020 | Jung | H10D 62/118 |
| 2021/0119031 | A1 * | 4/2021 | Song | H10D 30/6735 |
| 2022/0310452 | A1 * | 9/2022 | Wu | H10D 84/83 |
| 2022/0328648 | A1 * | 10/2022 | Wong | H10D 64/017 |
| 2022/0344465 | A1 * | 10/2022 | Chen | H10D 84/834 |
| 2022/0367620 | A1 * | 11/2022 | Yang | H10D 62/116 |
| 2023/0178596 | A1 * | 6/2023 | Zhou | H10D 84/013 |
| | | | | 257/288 |
| 2023/0275123 | A1 * | 8/2023 | Liu | H10D 62/118 |
| 2023/0343819 | A1 * | 10/2023 | Liu | H10D 62/116 |
| 2023/0361176 | A1 * | 11/2023 | Chang | H10D 62/121 |
| 2023/0411481 | A1 * | 12/2023 | Chang | H10D 84/83 |
| 2024/0105806 | A1 * | 3/2024 | Chang | H10D 30/6735 |
| 2025/0040183 | A1 * | 1/2025 | Chang | H10D 64/256 |
| 2025/0234611 | A1 * | 7/2025 | Kwok | H10D 62/116 |
| 2025/0366060 | A1 * | 11/2025 | Wang | H10D 84/017 |
| 2025/0374584 | A1 * | 12/2025 | Chou | H10D 30/43 |
| 2025/0380457 | A1 * | 12/2025 | Wang | H10D 30/6735 |
| 2026/0047156 | A1 * | 2/2026 | Lin | H10D 62/116 |

* cited by examiner

10

10

DEVICE HAVING EXTENDED
SOURCE/DRAIN CONTACT AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
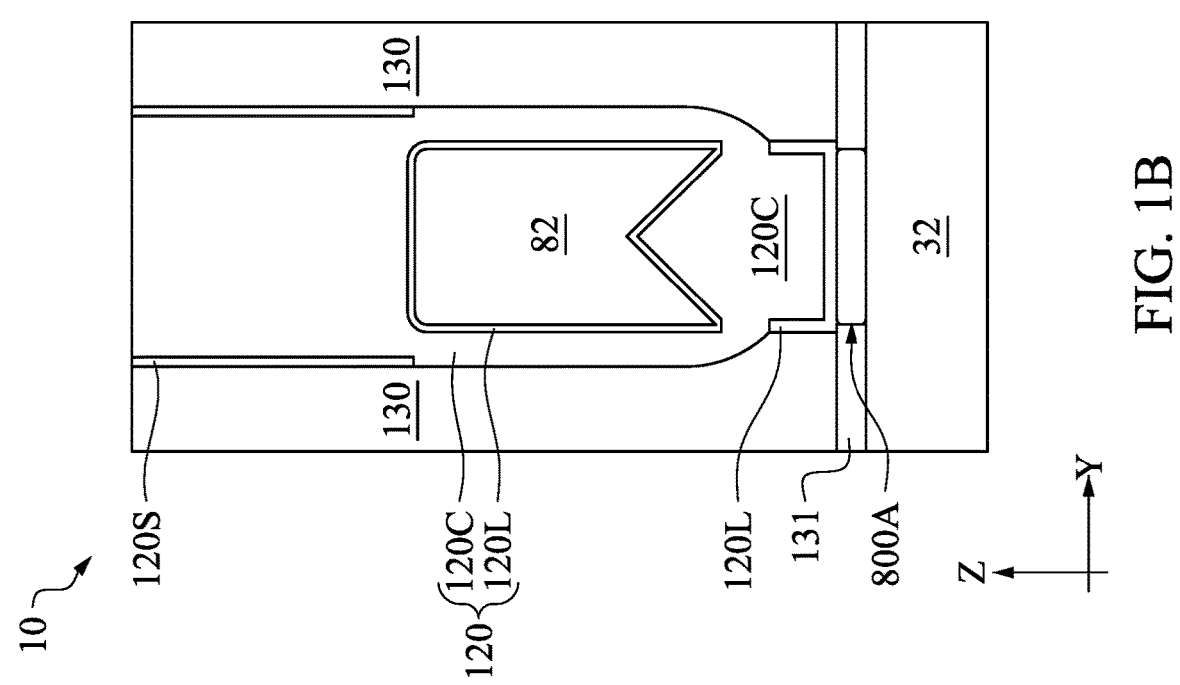
FIGS. 1A and 1B are diagrammatic cross-sectional side views of a portion of an IC device in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Throughout the disclosure, source/drain region(s) may refer to a source or a drain, individually or collectively dependent upon the context.

The present disclosure is generally related to electronic devices, and more particularly to electronic devices that include field-effect transistors (FETs), such as planar FETs, three-dimensional fin FETs (FinFETs) or nanostructure FETs, such as gate-all-around (GAA) FETs, nanosheet (NS) FETs, nanowire (NW) FETs, and the like. In GAAFETs, the gate-all-around structure provides beneficial electrostatic control over the channel region. With the gate surrounding the nanosheets from all sides, gate control is enhanced and the possibility of leakage current is reduced, which improves transistor performance, including improved on-state current, reduced off-state leakage and enhanced switching characteristics.

In embodiments of the disclosure, a source/drain contact is formed to wrap around a source/drain region. The source/drain contact wrapping around the source/drain region is beneficial to reduce parasitic resistance, which improves duty cycle ratio performance. In the embodiments, a void is formed in the source/drain region and a dielectric film is formed therein instead of a contact etch stop layer (CESL) film. A dielectric film treatment is performed in the vertical direction to harden the dielectric film. Unexposed portions of the dielectric film (e.g., untreated side portions) are removed, which prepares leaves the dielectric film as a protective layer on the upper surface of the source/drain region while opening the void for deposition of conductive material of the source/drain contact in a later operation.

Nanostructure device structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure device structure.

Figure 1A:
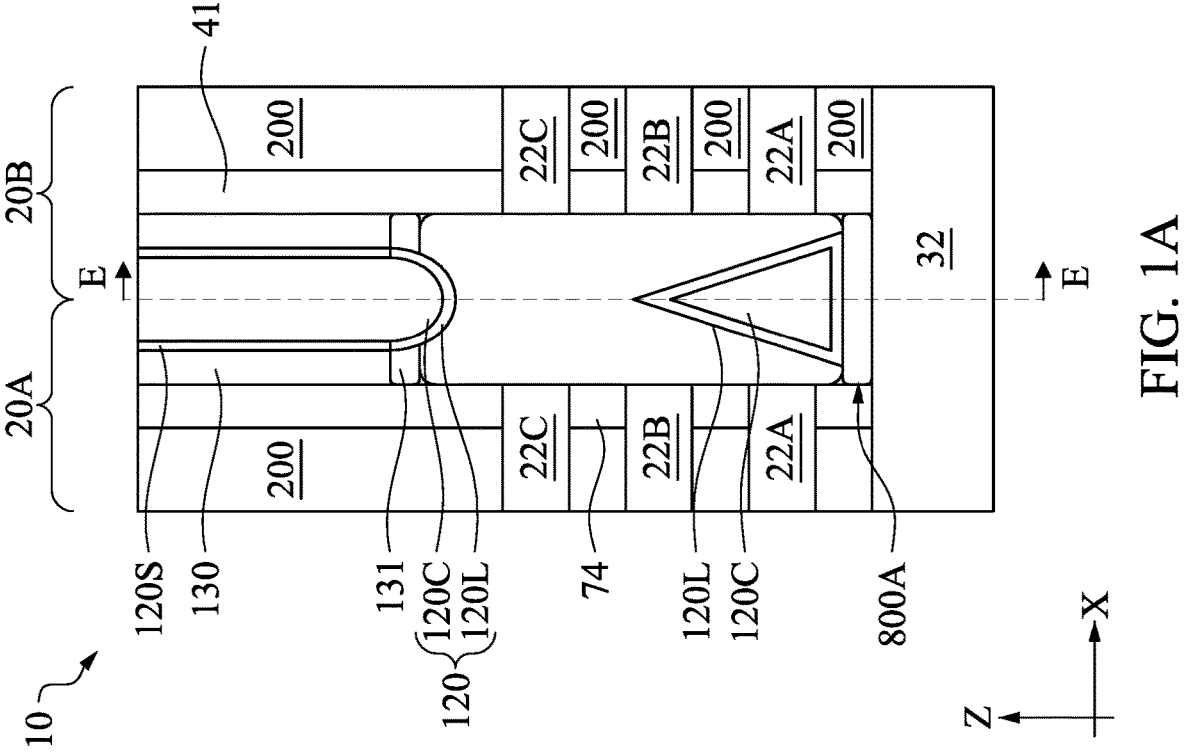

FIGS. 1A and 1B are diagrammatic cross-sectional side views of a portion of an IC chip 10 in accordance with various embodiments. FIG. 1A depicts a portion of the IC chip 10 cut along a semiconductor fin 32 (or "fin" or "fin structure") along a first direction, which is an X-axis direction. FIG. 1B depicts a portion of the IC chip 10 cut along source/drain regions 82 along a second direction, which is a Y-axis direction perpendicular to the X-axis direction.

In FIG. 1A, a portion of the IC chip 10 is shown. The IC chip 10 includes a first nanostructure device 20A and a second nanostructure device 20B, which may be referred to collectively as the nanostructure devices 20A, 20B. Each of the nanostructure devices 20A, 20B includes channels 22A, 22B, 22C, source/drain regions 82 and a gate structure 200. In the nanostructure devices 20A, 20B, channels 22A, 22B, 22C of each device are in contact with the source/drain region 82 on either side thereof (only one source/drain region 82 is depicted in FIG. 1A for simplicity). The gate structures 200 wrap around the respective channels 22A, 22B, 22C of each nanostructure device 20A, 20B. A voltage bias applied at the gate structure 200 causes the channels 22A, 22B, 22C to conduct electrical current, which flows from one of the source/drain regions 82 to the other of the source/drain regions 82 based on a voltage bias applied to each. Voltage bias may be applied to the source/drain region 82 via a source/drain contact 120 that includes a liner layer 120L and a core layer 120C that each wrap around the source/drain region 82 as depicted in FIG. 1B. Other features of the IC chip 10 are described in greater detail below with reference to process 1000 as depicted in FIGS. 2A-13. In some embodiments, the nanostructure devices 20A, 20B are part of a static random access memory (SRAM) circuit, a logic circuit, an input/output (IO) circuit, a passive device or the like.

FIGS. 2A-12 are views of various embodiments of an IC device, e.g., the IC chip 10, at various stages of fabrication according to various aspects of the present disclosure. FIG. 13 is a flowchart illustrating a method 1000 of fabricating a semiconductor device according to various aspects of the present disclosure. The various stages of fabrication of the IC device illustrated in FIGS. 2A-12 may be performed in accordance with the method of FIG. 13. FIG. 13 illustrates a flowchart of method 1000 for forming an IC device or a portion thereof from a workpiece, according to one or more aspects of the present disclosure. Method 1000 is an example and is not intended to limit the present disclosure to what is explicitly illustrated in method 1000. Additional acts can be provided before, during and after the method 1000 and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2A-12, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as is beneficial to the context.

FIGS. 2A through 12 are diagrammatic perspective and cross-sectional views of intermediate stages in the manufacturing of FETs, such as nanosheet FETs, in accordance with some embodiments. FIGS. 2A, 3A, 4A, 5A, 6A, 7A, 8A, 9A and 10A illustrate perspective views. FIGS. 2B, 3B, 4B, 5B, 6B, 7B, 8B, 8E, 8G, 8I, 8K, 8M, 9B, 10B, 11C, 11E, 11G, 11H, 11I and 12 illustrate side views taken along reference cross-section B-B' (gate cut or source/drain cut; YZ plane) shown in FIGS. 2A, 3A and 4A. FIGS. 4C, 5C, 6C, 7C, 8C, 8D, 8F, 8H, 8J, 8L, 9C, 10C, 11A, 11B, 11D, 11F and 11J illustrate side views taken along reference cross-section C-C' (fin cut; XZ plane) illustrated in FIG. 4A.

Figure 2B:
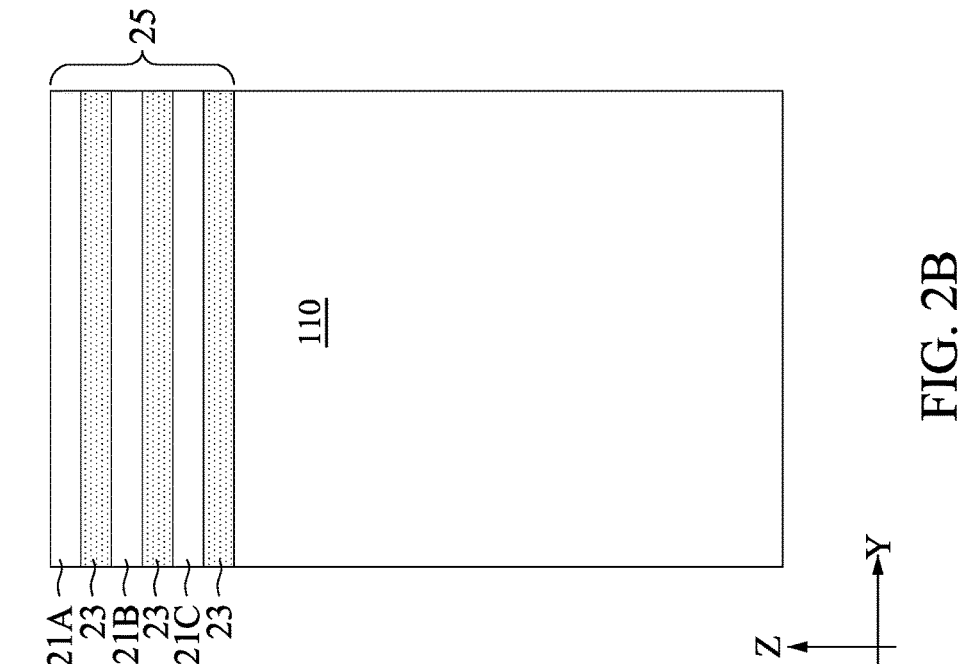
FIGS. 2A-12 are views of various embodiments of an IC device at various stages of fabrication according to various aspects of the present disclosure.
Figure 2A:
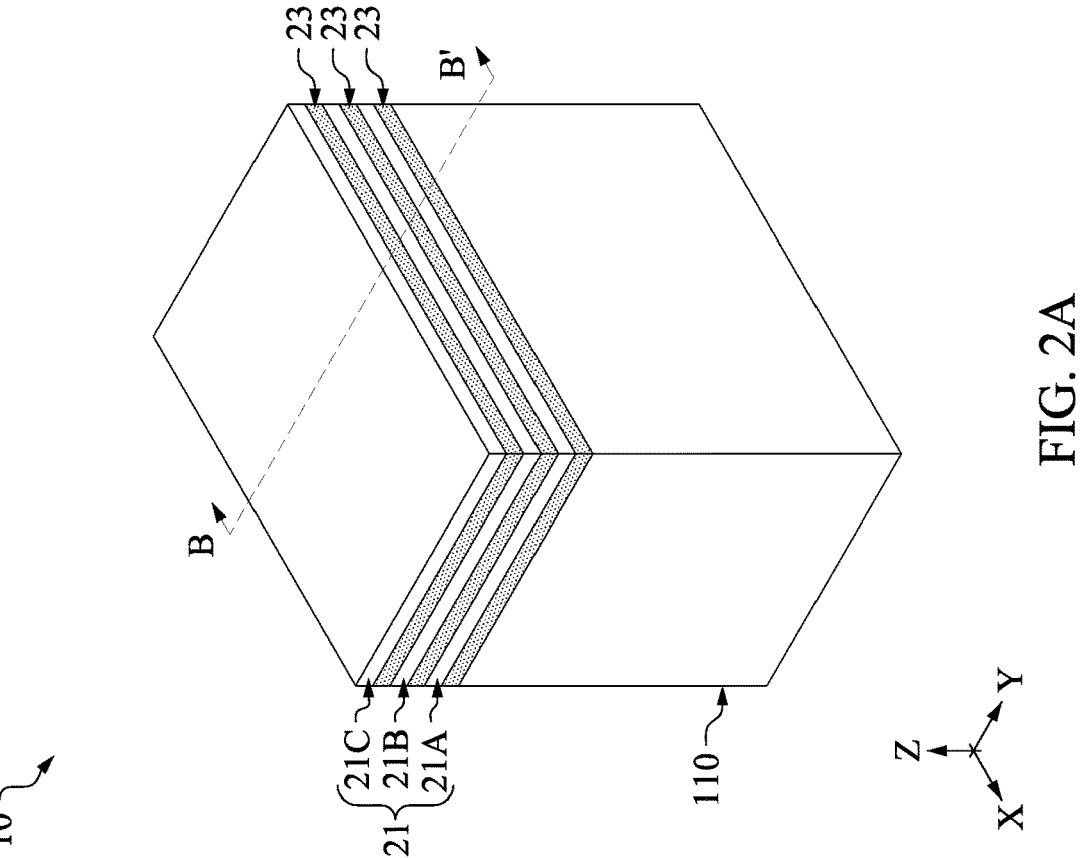

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" or "super lattice" is formed over the substrate 110 of alternating layers of first semiconductor layers 21A, 21B, 21C (collectively referred to as first semiconductor layers 21) and second semiconductor layers 23, corresponding to act 1100 of FIG. 13. In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is depicted as including a second semiconductor layer 23 as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nanostructure FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nanostructure FETs.

Figure 3B:
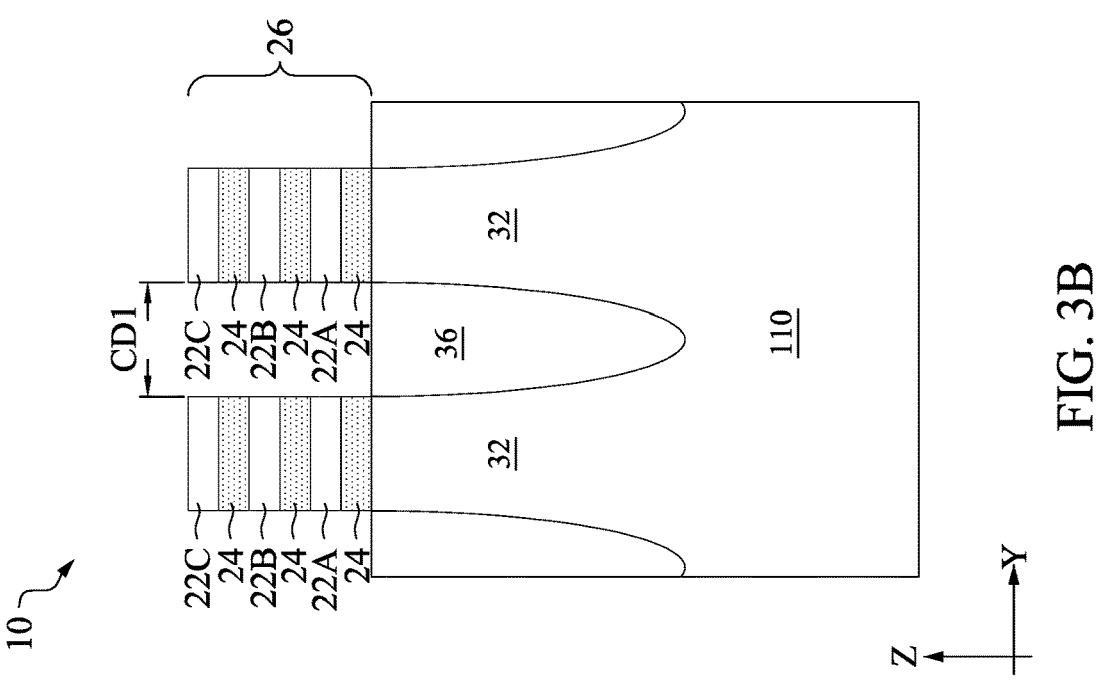
Figure 3A:
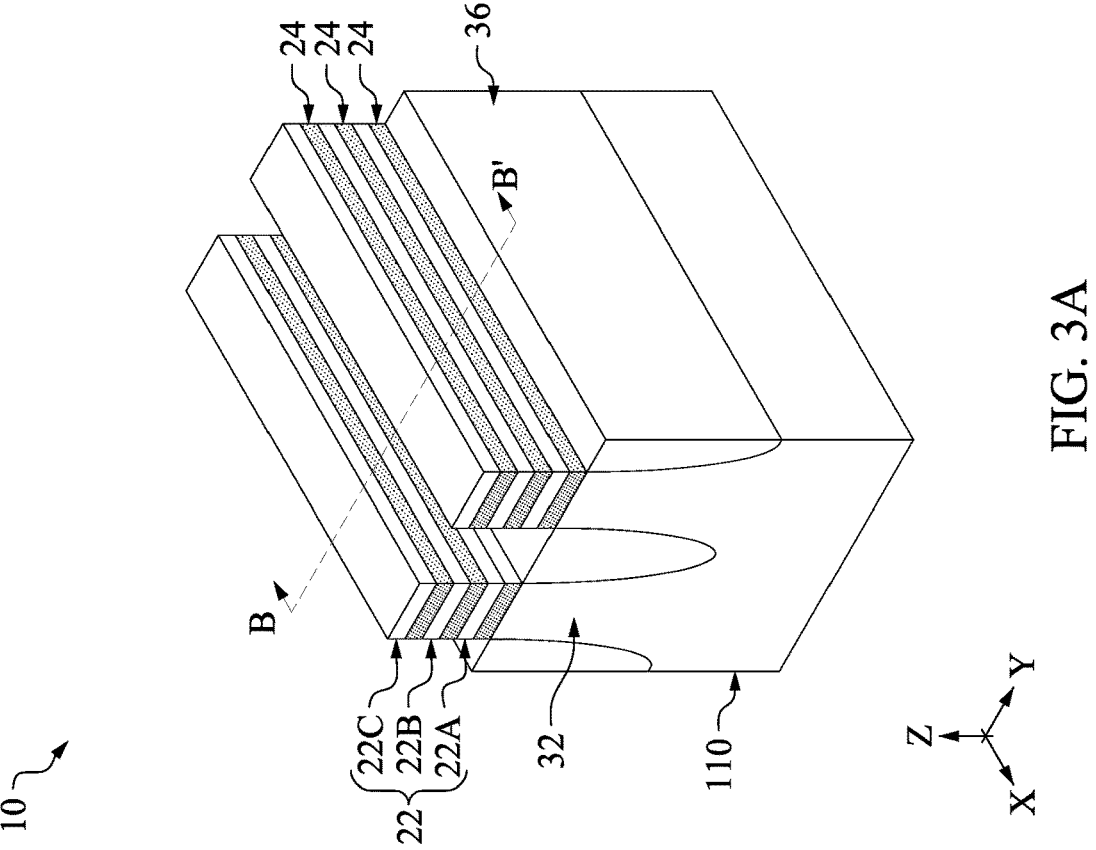

In FIG. 3A and FIG. 3B, fins 32 and vertical stacks 26 of nanostructures 22A, 22B, 22C, 24 are formed in the substrate 110 and the multi-layer stack 25, corresponding to act 1200 of FIG. 13. The nanostructures 22A-22C may be referred to collectively as the nanostructures 22. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A, 22B, 22C (also referred to as "channels" below) are formed from the first semiconductor layers 21, and second nanostructures 24 are formed from the second semiconductor layers 23. Distance CD1 between adjacent fins 32 and nanostructures 22, 24 may be from about 18 nm to about 100 nm, less than 18 nm or greater than 100 nm. A portion of the device 10 is illustrated in FIGS. 3A and 3B including two fins 32 for simplicity of illustration. The process 1000 illustrated in FIGS. 2A-13 may be extended to any number of fins and is not limited to the two fins 32 shown in FIGS. 3A-11J. In some of the figures, three fins are depicted instead of two.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32, corresponding to act 1300 of FIG. 13. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, the insulation material, such as those discussed above, may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

In some embodiments, the spacing between the channels 22A-22C (e.g., between the channel 22B and the channel 22A or the channel 22C) is in a range between about 8 nanometers (nm) and about 12 nm. In some embodiments, the spacing is less than 8 nm. In some embodiments, a thickness (e.g., measured in the Z-direction) of each of the channels 22A-22C is in a range between about 5 nm and about 8 nm. In some embodiments, the thickness is less than 5 nm. In some embodiments, a width (e.g., measured in the Y-direction) of each of the channels 22A-22C is at least about 8 nm. In some embodiments, the width is less than 8 nm.

Further in FIG. 3A and FIG. 3B, appropriate wells (not separately illustrated) may be formed in the fins 32, the nanostructures 22, 24, and/or the isolation regions 36. Using masks, an N-type impurity implant may be performed in P-type regions of the substrate 110, and a P-type impurity implant may be performed in N-type regions of the substrate 110. Example N-type impurities may include phosphorus, arsenic, antimony, or the like. Example P-type impurities may include boron, boron fluoride, indium, or the like. An anneal may be performed after the implants to repair implant damage and to activate the P-type and/or N-type impurities. In some embodiments, in situ doping during epitaxial growth of the fins 32 and the nanostructures 22, 24 may obviate separate implantations, although in situ doping and implantation doping may be used together.

In FIGS. 4A-4D, dummy or sacrificial gate structures 40 are formed over the fins 32 and/or the nanostructures 22, 24, corresponding to operation 1400 of FIG. 13. A sacrificial gate layer 45 is formed over the fins 32 and/or the nanostructures 22, 24. The sacrificial gate layer 45 may be made of or include materials that have a high etching selectivity versus the isolation regions 36. The sacrificial gate layer 45 may be a conductive, semiconductive, or non-conductive material and may be include amorphous silicon, polycrystalline-silicon (polysilicon), poly-crystalline silicon-germanium (poly-SiGe), metallic nitrides, metallic silicides, metallic oxides, metals, combinations thereof and the like. The sacrificial gate layer 45 may be deposited by physical vapor deposition (PVD), CVD, sputter deposition, or other techniques for depositing the selected material. A mask layer 47 is formed over the sacrificial gate layer 45, and may include, for example, silicon nitride, silicon oxynitride, or the like. The mask layer 47 may include one or more layers, such as a first mask layer and a second mask layer. The first mask layer may be formed in a first deposition process, and the second mask layer may be formed in a second deposition process following the first deposition process. In some embodiments, a gate dielectric layer (not separately depicted) is formed before the sacrificial gate layer 45 between the sacrificial gate layer 45 and the fins 32 and/or the nanostructures 22, 24.

A spacer layer or sidewall spacer 41 is formed over sidewalls of, and covering, the mask layer 47, the sacrificial gate layer 45 and the isolation regions 36. The spacer layer 41 is made of an insulating material, such as SiN, SiO, SiCN, SiON, SiOCN, SiOC or the like, and may have a single-layer structure or a multi-layer structure including a plurality of dielectric layers, in accordance with some embodiments. The spacer layer 41 may be formed by depositing a spacer material layer (not shown) over the mask layer 47 and the sacrificial gate layer 45. In some embodiments, the spacer layer 41 includes one or more material layers. For example, the spacer layer 41 may include a first spacer layer in contact with the sacrificial gate structures 40 and a second spacer layer in contact with the first spacer layer. The first spacer layer may be formed in a first deposition process, and the second spacer layer may be formed in a second deposition process following the first deposition process.

In some embodiments, portions of the spacer material layer between sacrificial gate structures 40 are not removed. For example, horizontal portions of the spacer layer 41 are present on and in contact with respective upper surfaces of the isolation regions 36. Thickness of the spacer layer 41 may be in a range of about 5 nm to about 20 nm following deposition thereof. Although not depicted in a top view, the spacer layer 41 may cover the isolation regions 36. The spacer layer 41 may completely cover the isolation regions 36. In some embodiments, the spacer layer 41 substantially completely covers the isolation regions 36. For example, the spacer layer 41 may cover at least 95%, at least 90%, at least 80% or another suitable percentage of each of the isolation regions 36, which is beneficial to provide protection of the isolation regions 36 during etching operations performed when forming source/drain openings and epitaxial layers that isolate channel(s) 22 from source/drain regions 82. In some embodiments, the first spacer layer and the second spacer layer cover the isolation regions 36 as just described. In some embodiments, the second spacer layer may be removed from over the isolation regions 36, such that only the first spacer layer covers the isolation regions 36. It should be understood that the first and second spacer layers may cover respective peripheral portions of the isolation regions 36 regardless of whether the second spacer layer is removed from over, for example, respective central portions of the isolation regions 36.

Figure 4B:
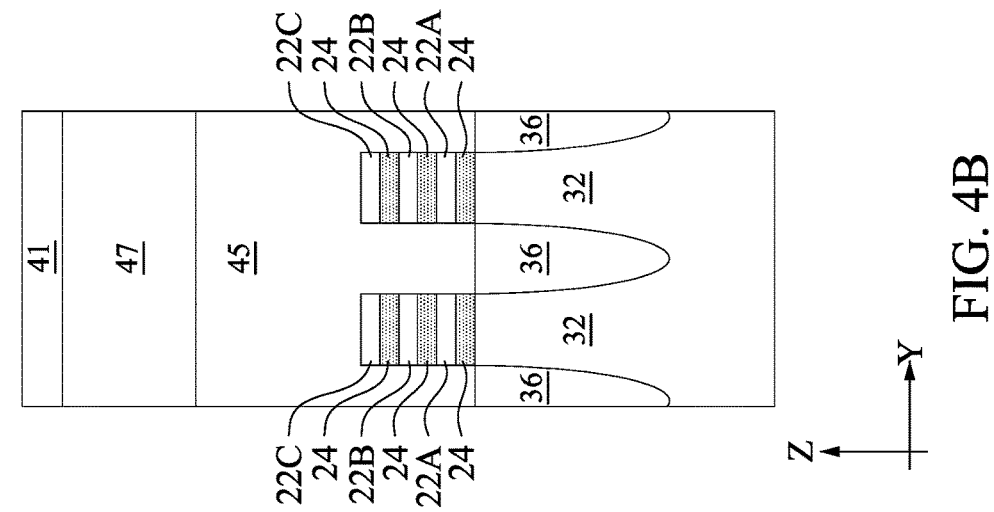
Figure 4A:
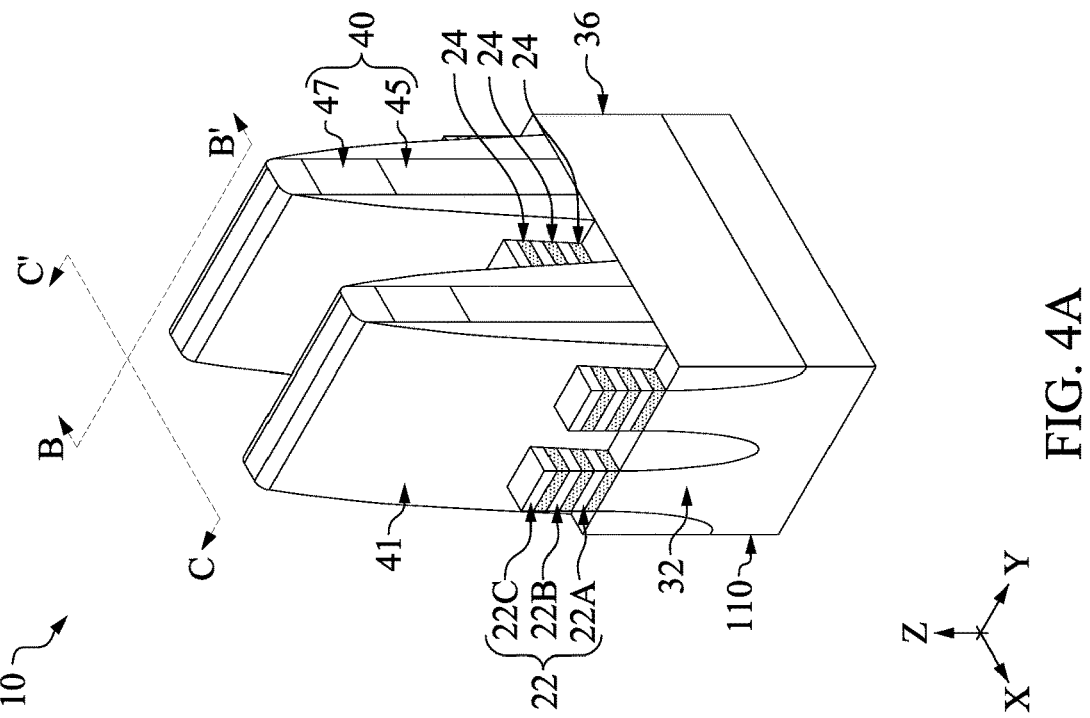

FIGS. 4A and 4B depict one process for forming the spacer layer 41. In some embodiments, additional spacer layers may be formed after removal of the sacrificial gate layer 45. In such embodiments, the sacrificial gate layer 45 is removed, leaving an opening, and the spacer layers may be formed by conformally coating material of the spacer layers along sidewalls of the opening. The conformally coated material may then be removed from the bottom of the opening corresponding to the top surface of the uppermost channel, e.g., the channel 22A, prior to forming an active gate, such as the gate structure 200.

Figure 5B:
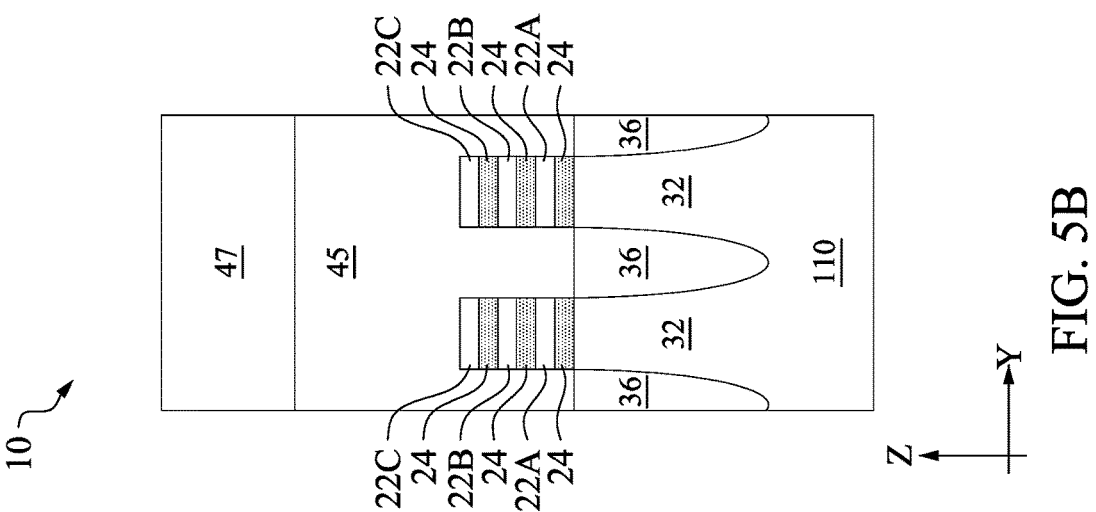
Figure 5A:
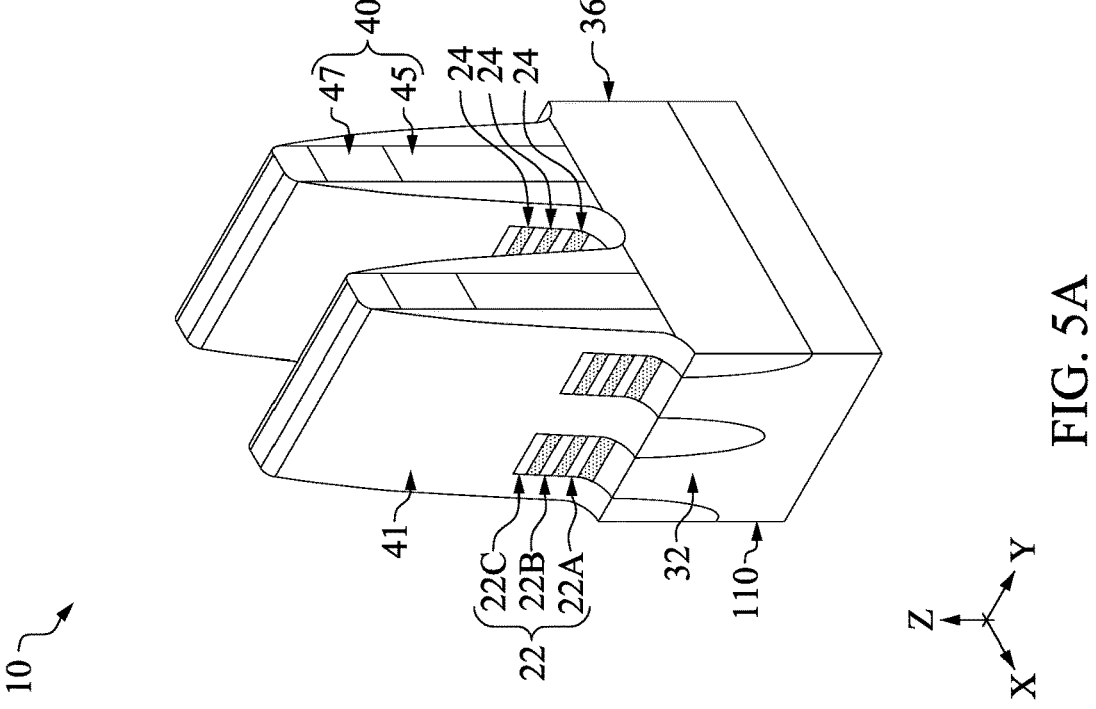
Figure 5C:
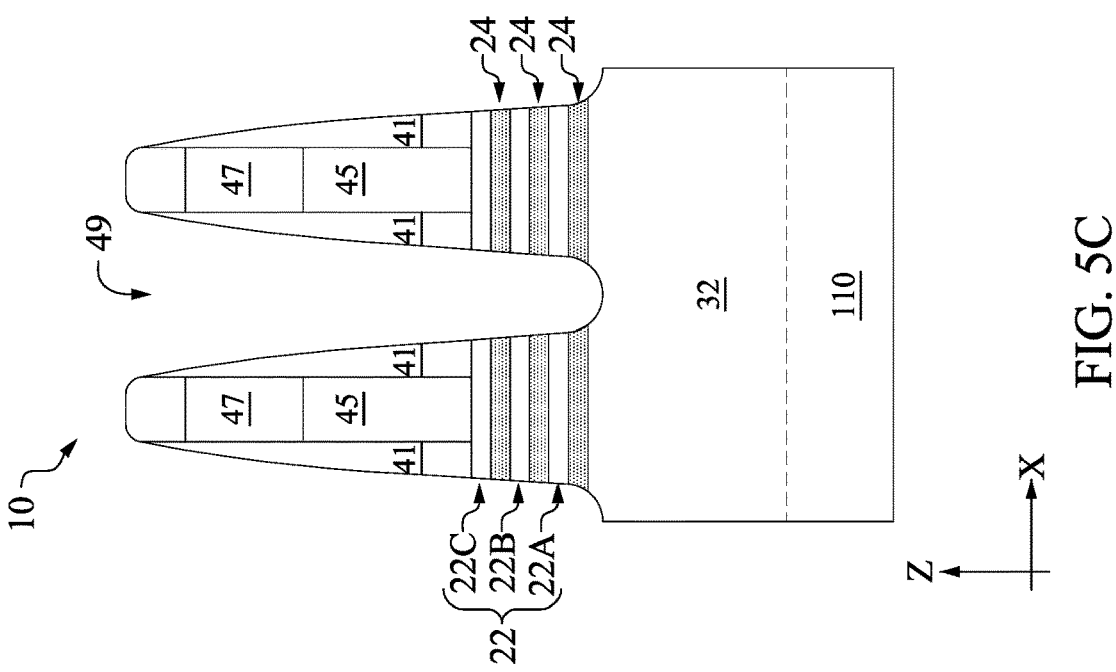

In FIGS. 5A-5C, an etching process that includes one or more etching operations is performed to etch the portions of protruding fins 32 and/or nanostructures 22, 24 that are not covered by sacrificial gate structures 40, resulting in the structure shown. The recessing forms source/drain openings 49 between neighboring stacks of channels 22 that are over the same fin 32, corresponding to operation 1500 of FIG. 13. The recessing may be anisotropic, such that the portions of fins 32 directly underlying sacrificial gate structures 40 and the spacer layer 41 are protected and are not etched. The top surfaces of the recessed fins 32 may be substantially coplanar with the top surfaces of the isolation regions 36, in accordance with some embodiments. In some embodiments, the top surfaces of the recessed fins 32 may be concave and somewhat lower than the top surfaces of the isolation region 36. FIG. 5C shows two vertical stacks 26 of nanostructures 22, 24 following the etching process for simplicity. In general, the etching process may be used to form any selected number of vertical stacks 26 of nanostructures 22, 24 over the fins 32. In some embodiments, the spacer layer 41 covers the isolation regions 36, such that the etching that forms the source/drain openings 49 does not substantially attack the isolation regions 36, and the isolation regions 36 protect sidewalls of the fins 32.

Figure 6A:
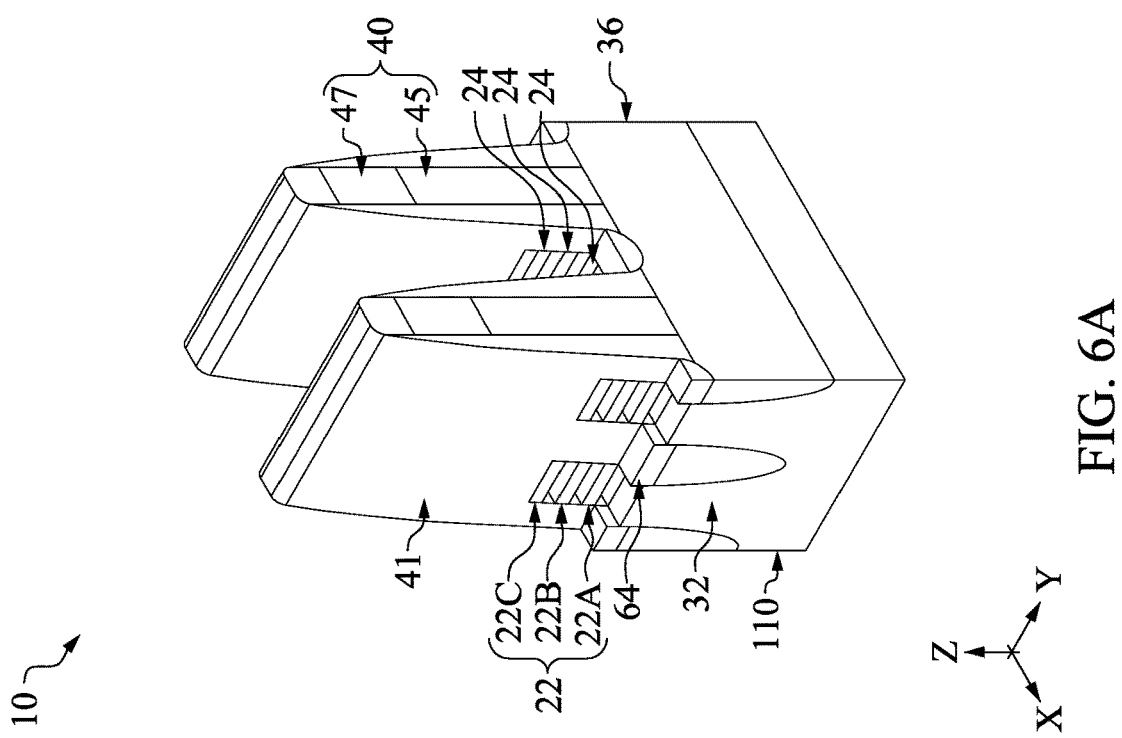
Figure 6C:
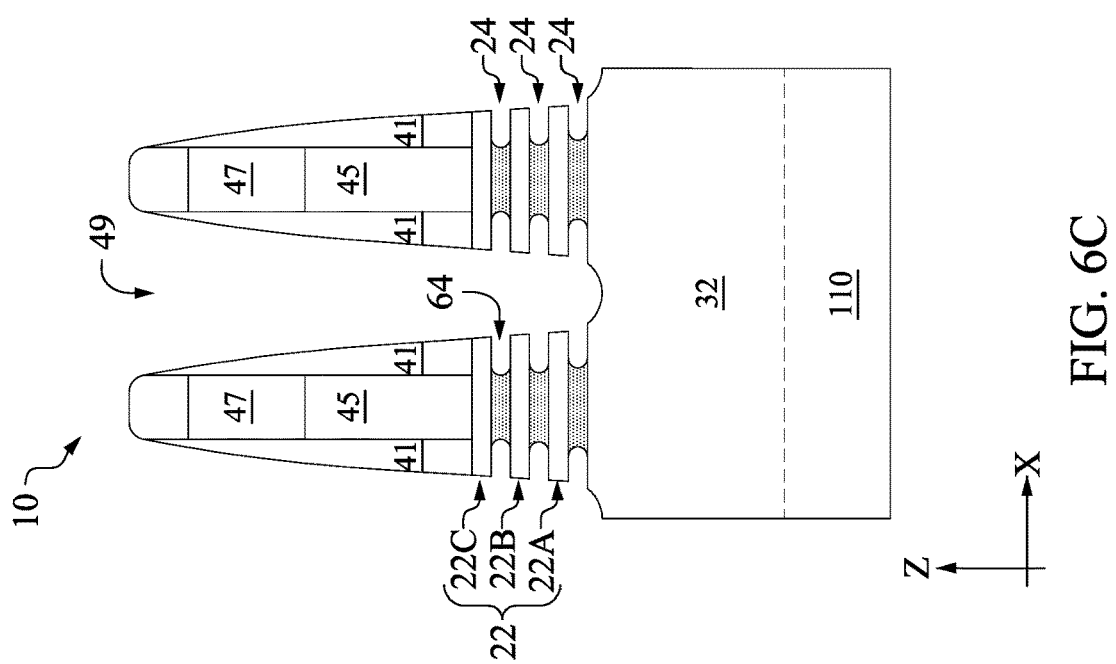
Figure 6B:
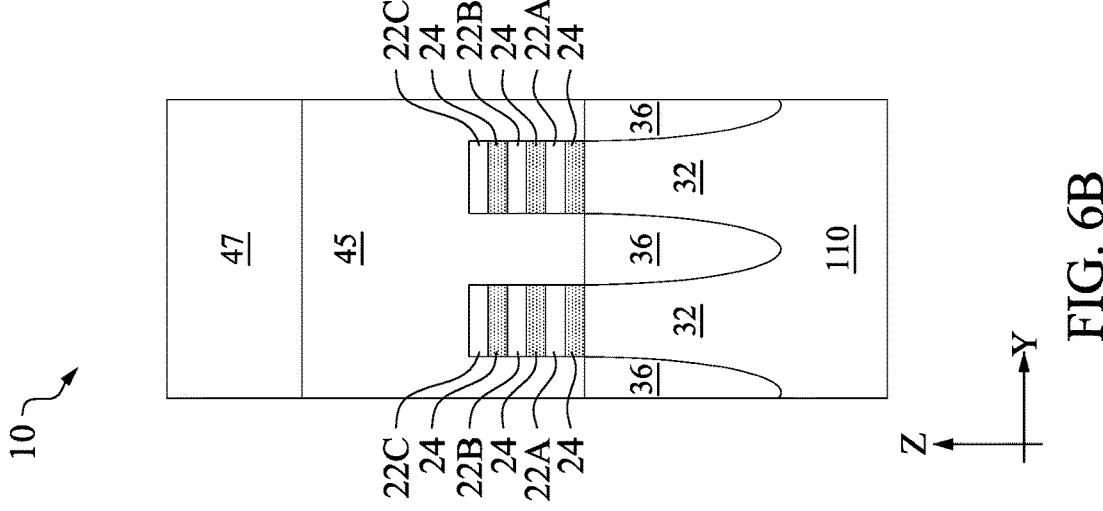

FIGS. 6A-6C and 7A-7C illustrate formation of inner spacers 74. A selective etching process is performed to recess end portions of the nanostructures 24 exposed by openings in the spacer layer 41 without substantially attacking the nanostructures 22, which is depicted in FIGS. 6A-6C. After the selective etching process, recesses 64 are formed in the nanostructures 24 at locations where the removed end portions used to be. The resulting structure is shown in FIGS. 6A-6C.

Figure 7B:
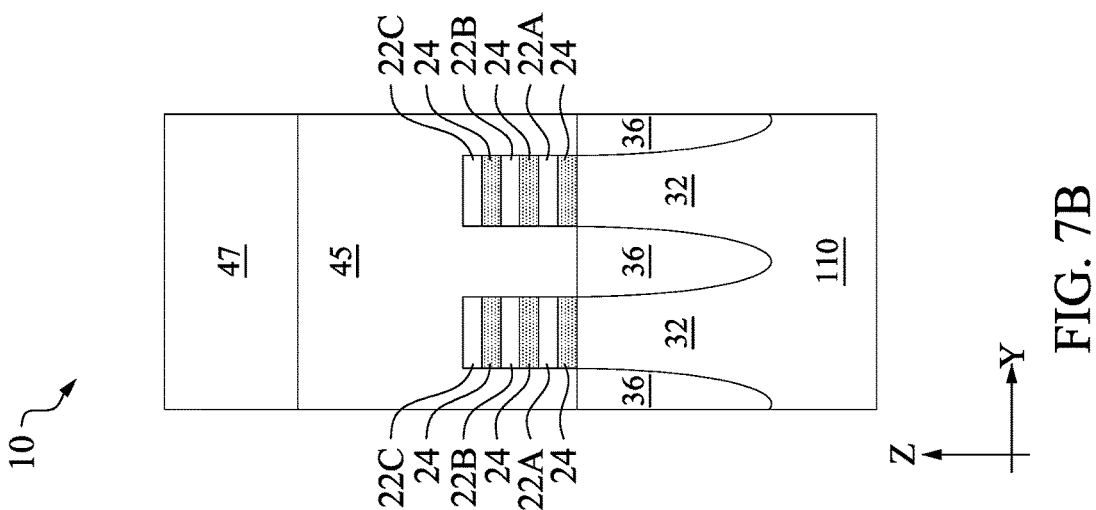
Figure 7A:
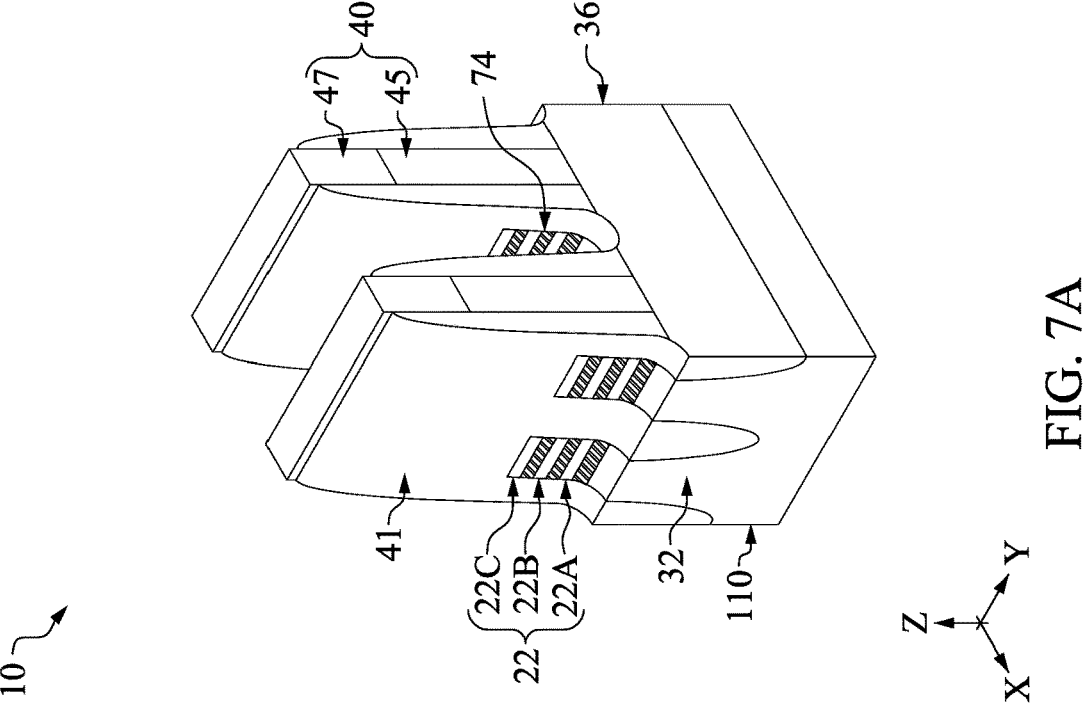
Figure 8A:
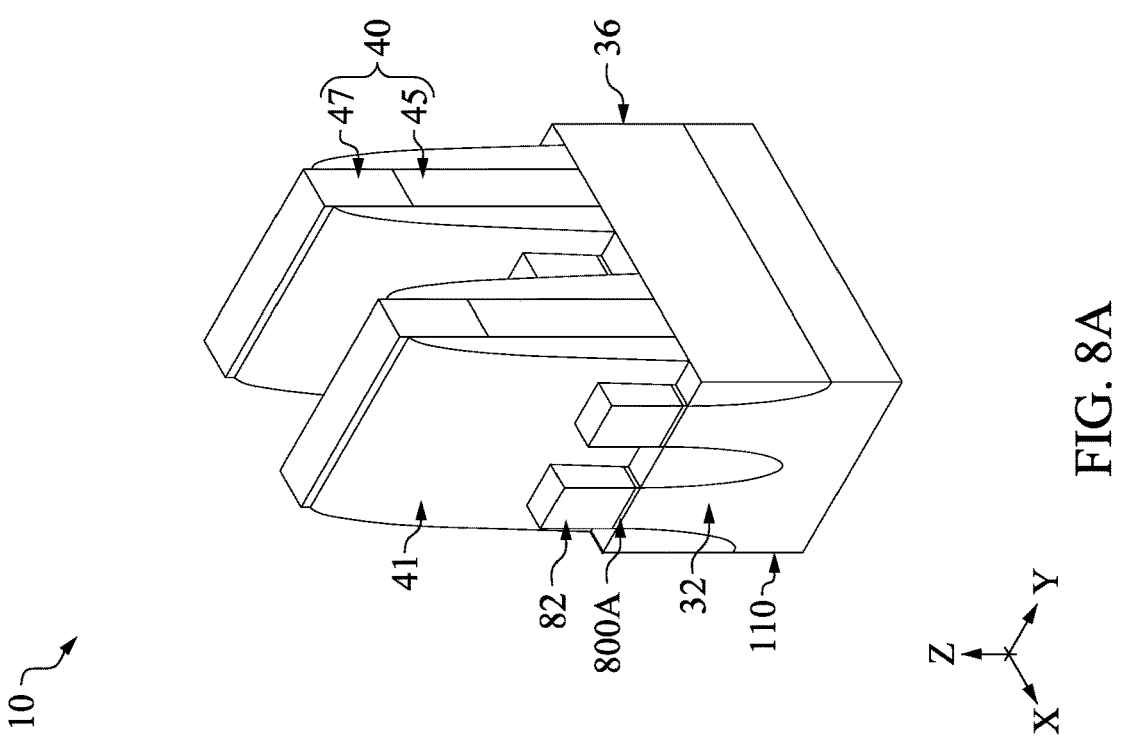
Figure 7C:
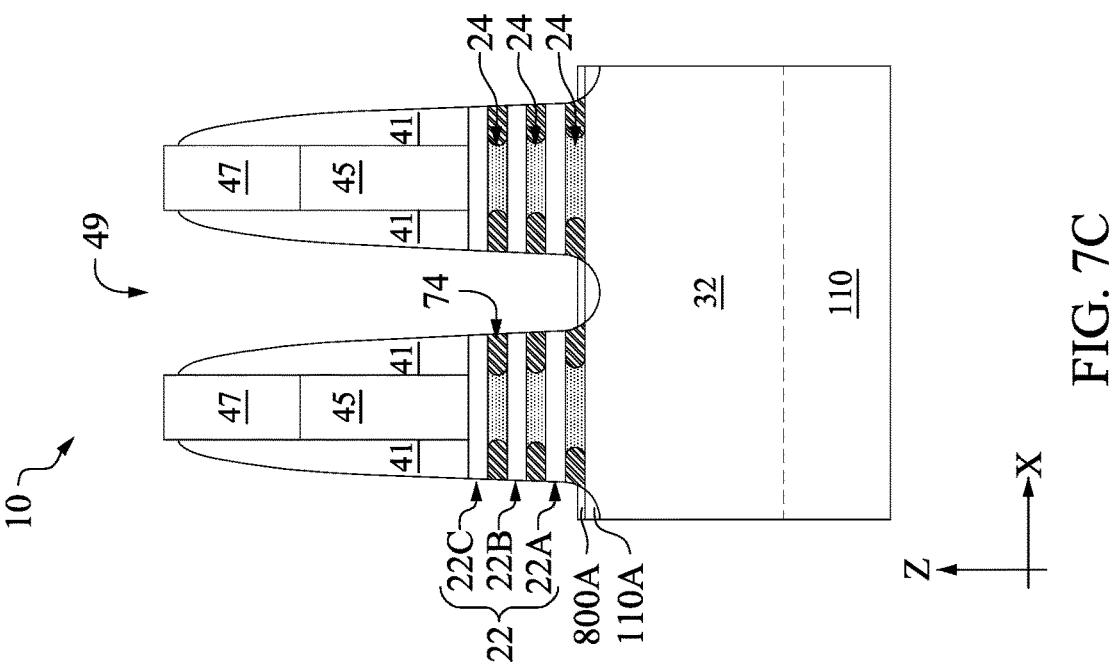

Next, following formation of the recesses 64 in FIGS. 6A-6C, an inner spacer layer is formed to fill (e.g., partially or fully) the recesses 64 in the nanostructures 22 formed by the previous selective etching process, which is depicted in FIGS. 7A-7C. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7C.

FIG. 7C also depicts formation of epitaxial layers and bottom dielectric layer 800A in accordance with various embodiments, corresponding to act 1600 of FIG. 13. Following formation of the source/drain openings 49 and the inner spacers 74, the source/drain openings 49 extend below the upper surface of the fins 32. In some embodiments, a first epitaxial layer 110A is formed in a portion of the source/drain openings 49 below the level of the upper surface of the fins 32, as depicted in FIG. 7C. The first epitaxial layer 110A may be an undoped semiconductor layer, such as an undoped silicon layer. The undoped silicon layer 110A may be grown in an epitaxial chamber using a process such as chemical vapor deposition (CVD). In the CVD, a silicon source gas, such as silane (SiH4), may be introduced into a heated chamber along with a carrier gas, such as hydrogen (H2). The gases react on the surface of the fins 32, which may be heated to a temperature between about 900° C. to 1100° C. During the reaction, the silicon source gas decomposes and releases silicon atoms, which then diffuse onto the surface of the fins 32 and form a single crystal layer of silicon. A low-pressure environment may be beneficial to reduce presence of impurities and improve deposition rate uniformity. To grow undoped silicon, no additional dopant gases are introduced into the chamber. The resulting layer has low level of impurities and is electrically neutral, such that the first epitaxial layer 110A may be an insulator layer. Formation of the first epitaxial layer 110A may be global, meaning that, for example, no mask is present on the IC chip 10 while the CVD is ongoing.

Following formation of the first epitaxial layer 110A, a second epitaxial layer (not depicted) may be formed in a portion of the source/drain openings 49. The second epitaxial layer may be an undoped semiconductor layer, such as an undoped silicon layer, and formation thereof may be similar to formation of the first epitaxial layer 110A. The second epitaxial layer may extend from the top of the fin 32 to a level that is above one or more of the channels 22, so as to isolate the one or more channels electrically and/or physically from source/drain regions 82 formed in a subsequent process. For example, the second epitaxial layer extends to a level that is above the bottommost channels 22C. In some embodiments, the second epitaxial layer may extend to any level that is above the bottommost channels 22C and below the uppermost channels 22A.

In FIG. 7C, following formation of the first epitaxial layer 110A and optionally the second epitaxial layer, a bottom dielectric layer 800A is formed. The bottom dielectric layer 800A or flexible bottom insulator ("FBI") is beneficial to prevent mesa leakage current in the IC chip 10. The bottom dielectric layer 800A may be in direct contact with the first epitaxial layer 110A. The bottom dielectric layer 800A may be formed a deposition operation and may include SiN, SiOC, SiOCN, SiCN, combinations thereof or the like. In some embodiments, the bottom dielectric layer may have thickness in a range of about 1 nm to about 5 nm. In some embodiments, the bottom dielectric layer has thickness greater than 5 nm.

FIGS. 8A-8M illustrate formation of source/drain regions 82 including respective voids 49V corresponding to act 1700 of FIG. 13. The voids 49V are omitted from view in FIGS. 8A-8C for simplicity of illustration and providing contextual description that references FIGS. 8A-8C. Formation of the voids 49V and a protective layer 131 is described with reference to FIGS. 8D-8M.

In the illustrated embodiment, the source/drain regions 82 are epitaxially grown from epitaxial material(s). In some embodiments, the source/drain regions 82 exert stress in the respective channels 22A2-22C2, thereby improving performance. The source/drain regions 82 are formed such that each sacrificial gate structure 40 is disposed between respective neighboring pairs of the source/drain regions 82. In some embodiments, the spacer layer 41 separates the source/drain regions 82 from the sacrificial gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

In some embodiments, a first epitaxial growth process may be performed to form n-type source/drain regions 82 and a second epitaxial growth process may be performed to form p-type source/drain regions 82. It should be understood that "first" and "second" can be interchanged in this context. For example, n-type epitaxial growth may precede or follow p-type epitaxial growth.

The source/drain regions 82 may be implanted with dopants followed by an anneal. The source/drain regions may have an impurity concentration of between about $10^{19}$ $cm^{-3}$ and about $10^{21}$ $cm^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity in FIGS. 8A-8C, may then be formed covering the sacrificial gate structures 40 and the source/drain regions 82. Formation of the contact etch stop layer (CESL) or "protective layer" 131 is described with reference to FIGS. 8F-8K and formation of the ILD 130 is described with reference to FIGS. 8L and 8M.

Figure 8C:
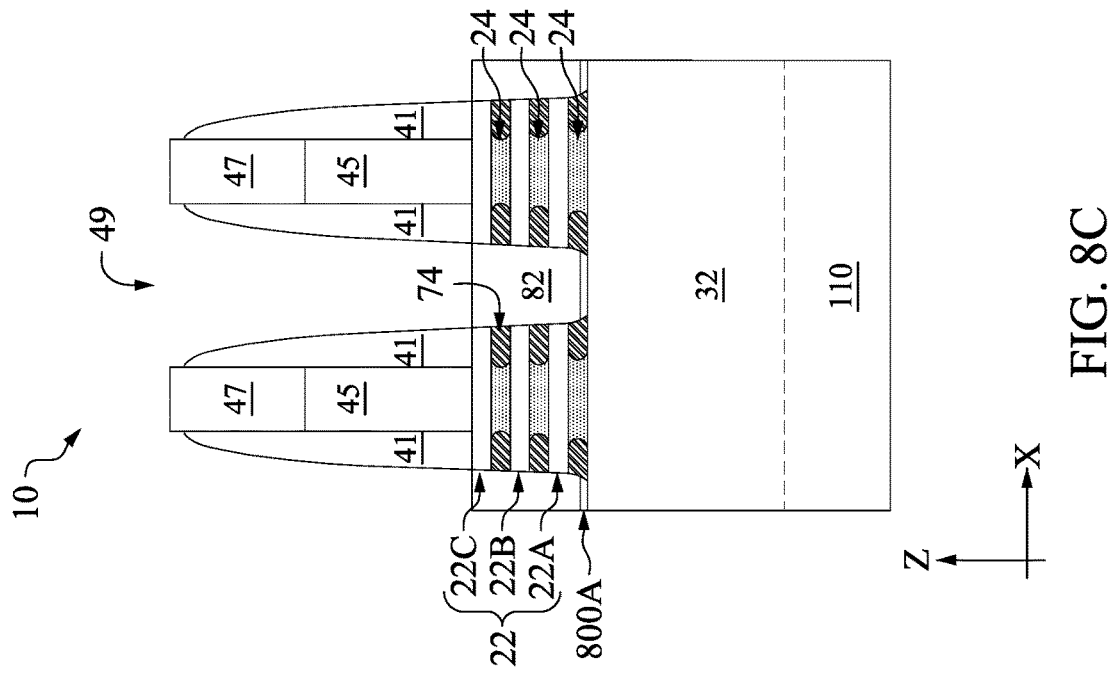
Figure 8B:
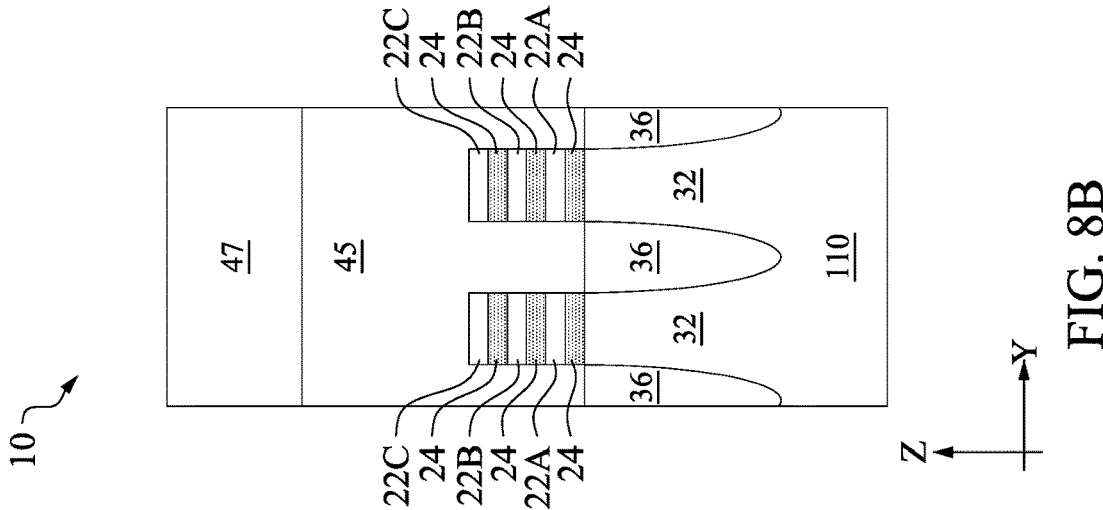
Figure 8E:
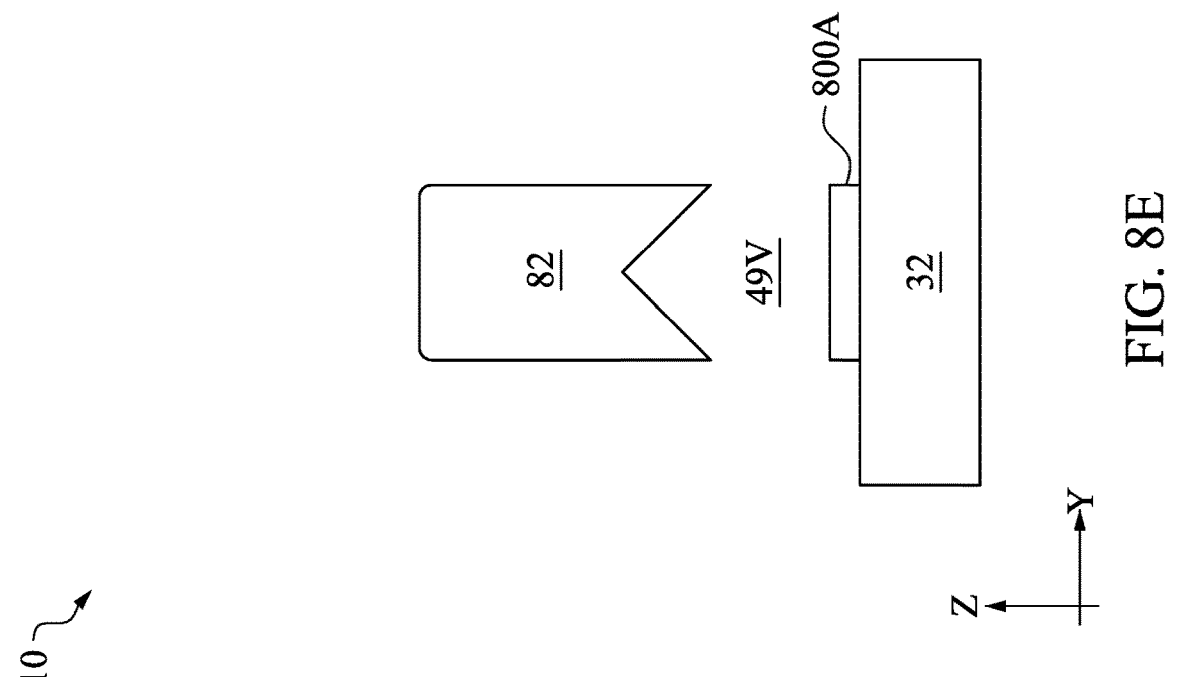
Figure 8D:
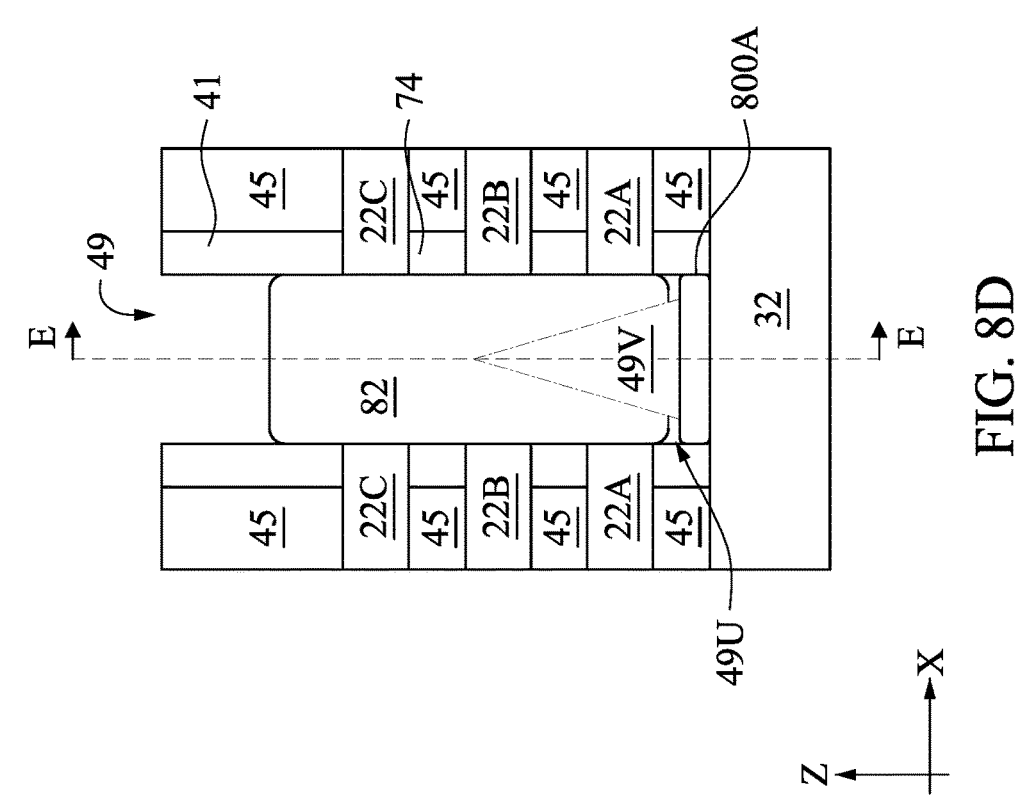

In FIGS. 8D and 8E, a void 49V is formed during growth of the source/drain region 82. The void 49V may have width in the horizontal direction (e.g., the X-axis direction and/or the Y-axis direction) that is in a range of about 10 nm to about 15 nm. The void 49V may have height in the vertical direction (e.g., the Z-axis direction) that is in a range of about 10 nm to about half the height of the source/drain region 82. The void 49V may be formed by selection of parameters of the epitaxial growth process that forms the source/drain region 82. For example, the void 49V may be formed by early merging of left and right sides of the source/drain region 82 depicted in FIG. 8D. Namely, an upper portion of the source/drain region 82 may merge before lower portions of the source/drain region 82 are able to merge. As such, the upper portion that has merged blocks further growth in the lower portions, leaving the void 49V shown.

The void 49V may extend from the bottom dielectric layer 800A to a level that is above the bottom dielectric layer 800A. In the example depicted in FIG. 8D, the void 49V extends to a level that is at or slightly above an upper surface of the channel 22B. In some embodiments, the void 49V extends to a level that overlaps the channel 22B, such as between the upper surface of the channel 22B and a lower surface of the channel 22B. In some embodiments, the void 49V extends to a level that is between the lower surface of the channel 22A and an upper surface of the channel 22B. In some embodiments, the void 49V extends to a level that overlaps the channel 22A, such as between the upper surface of the channel 22A and a lower surface of the channel 22A.

In the X-axis direction, as depicted in FIG. 8D, a lower region of the void 49V may include undercut regions 49U that extend under portions of the source/drain region 82 in contact with the lowermost channels 22A. In some embodiments, the undercut regions 49U are not present, as indicated by dot-dashed lines in FIG. 8D. Namely, the source/drain region 82 may extend down to contact the bottom dielectric layer 800A.

The void 49V is depicted in FIG. 8D as having straight, tapered sidewalls that terminate in a point at about the level of the upper surface of the channels 22B. In some embodiments, the top of the void 49V is concave, convex or a combination thereof. In some embodiments, the sidewalls of the void 49V are curved instead of straight. In some embodiments, the sidewalls of the void 49V are roughly vertical or vertical.

Some process parameters may be beneficial to formation of the void 49V. For example, process parameters may be selected that increase growth rate of the source/drain region 82. Raising the growth temperature may accelerate epitaxial growth rate. For example, the source/drain region 82 may be grown at a temperature greater than about 1000 degrees Celsius, greater than about 1100 degrees Celsius or greater than about 1150 degrees Celsius. Increasing flow rates of precursor gases, such as silane (SiH4) or dopant sources may increase the epitaxial growth rate. For example, the source/drain region 82 may be grown using a flow rate for one or more precursor gases (e.g., silane) that exceeds about 100 standard cubic centimeters per minute (sccm), exceeds about 150 sccm, exceeds about 200 sccm, or the like. Flowing precursor gases that are different from silane may lead to faster growth rates. For example, dichlorosilane (SiH2Cl2) may be used as a precursor for growing the source/drain region 82 instead of silane as a silicon source. Modulating pressure during epitaxial growth may vary diffusion of reactant gases and increase the growth rate. For example, a higher pressure may speed up the epitaxial growth rate.

Increasing surface cleanliness of the channels 22A-22C can increase nucleation and growth. For example, one or more of thorough cleaning, oxide removal and surface treatments may be performed, which is beneficial to increase the epitaxial growth rate. Use of a rotating or showerhead reactor may increase mass transport and facilitate faster growth rate by improving gas distribution and reducing boundary layer effects. One or more of the process parameter selections just described may be used individually or in combination to increase growth rate of the source/drain regions 82, which is beneficial to promote early merging and formation of the void 49V.

Figure 8G:
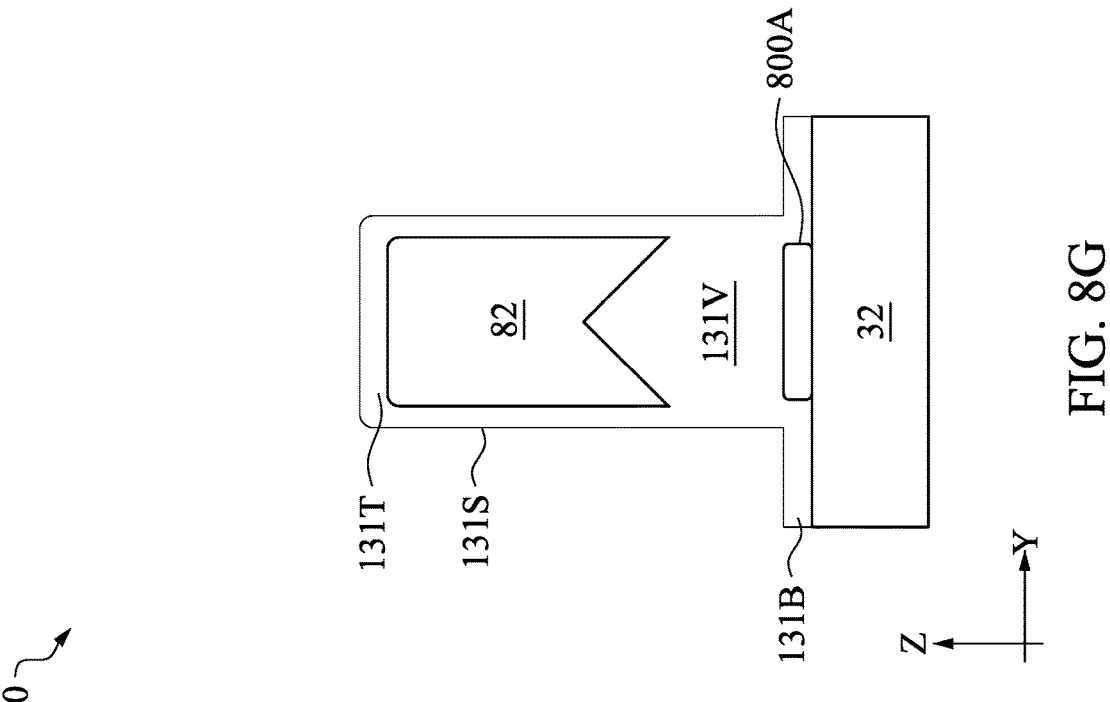
Figure 8F:
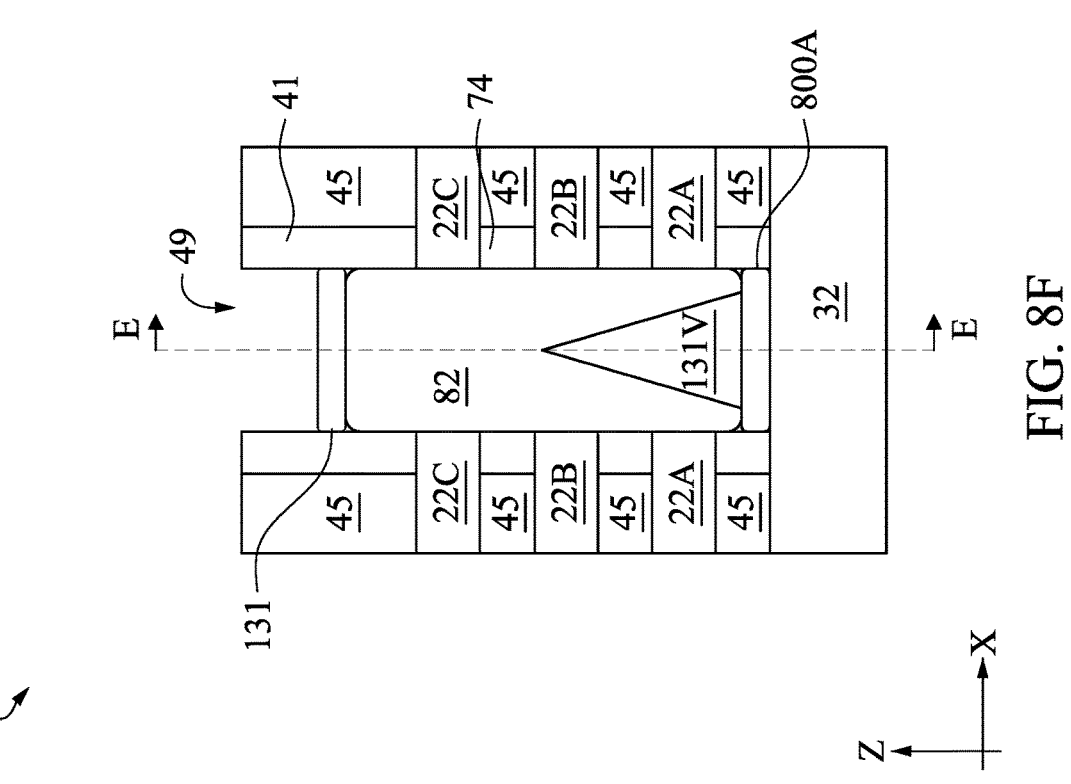

In FIGS. 8F and 8G, following formation of the source/drain region 82 including the void 49V, a dielectric layer 131 is formed on the source/drain region 82, corresponding to act 1800 of FIG. 13. The dielectric layer 131 may include a top portion 131T, sidewall portions 131S, bottom portions 131B and a void portion 131V. The top portion 131T may be on an upper surface of the source/drain region 82. The sidewall portions 131S may be on sidewalls of the source/drain region 82. The bottom portions 131B may be on exposed upper surfaces of the fin 32. The void portion 131V may be in the void 49V. In some embodiments, the void portion 131V fills the void 49V entirely or partially. The dielectric layer 131 may be a nitride, such as SiN, SiON, SiCN, SiOCN, or the like that is capable of having its etch selectivity increased through plasma treatment using N2 or Ar gas. Formation of the dielectric layer 131 may include one or more suitable deposition operations, such as a PVD, CVD, ALD or the like.

Figure 8I:
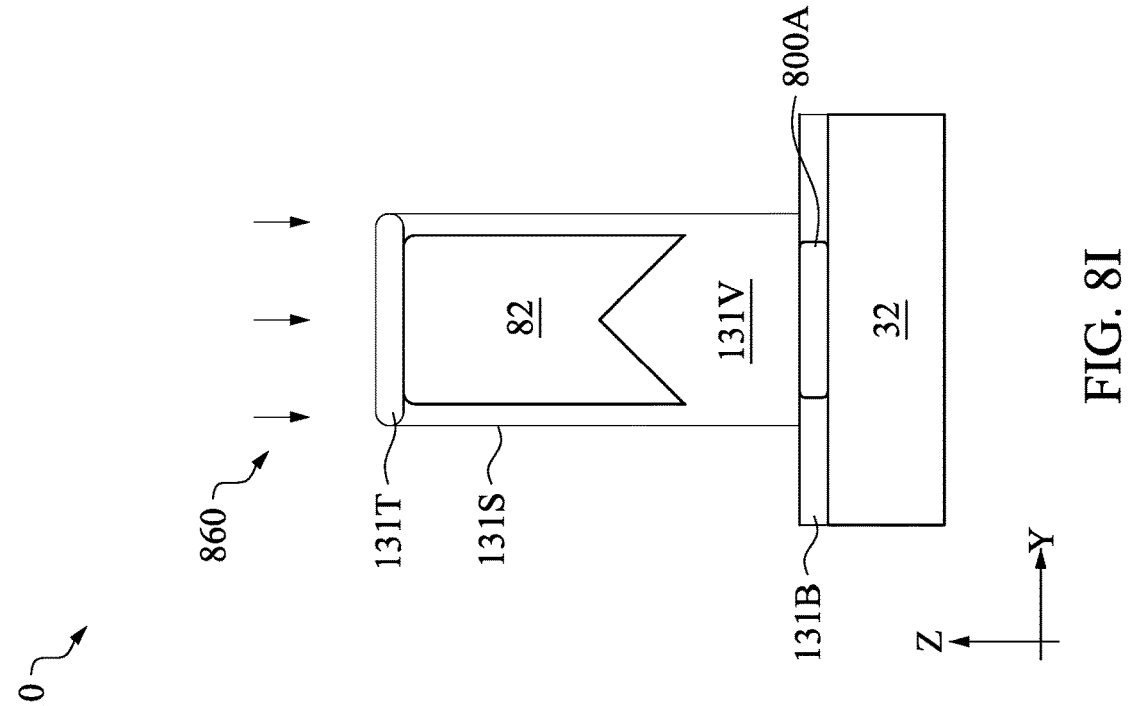
Figure 8H:
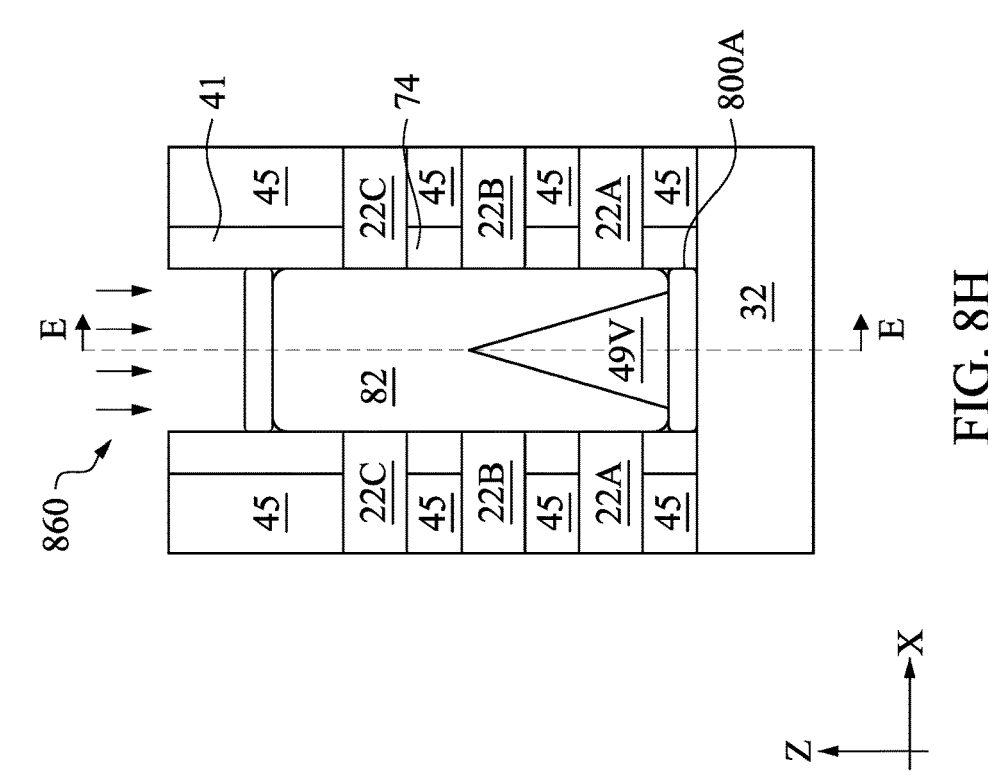

In FIGS. 8H and 8I, following formation of the dielectric layer 131, a plasma treatment 860 may be performed that hardens and/or increases etch selectivity of the top portion 131T and the bottom portions 131B of the dielectric layer 131, corresponding to act 1900 of FIG. 13. The plasma treatment 860 may be performed using a gas, such as N2 or Ar gas, and may have directionality in the Z-axis direction, such that the sidewall portions 131S and the void portion 131V are not hardened and/or do not have their etch selectivity increased. Increasing the etch selectivity of the top portion 131T slows etching of the top portion 131T relative to the sidewall and void portions 131S, 131V, which allows the sidewall and void portions 131S, 131V to be removed without substantially removing the top portion 131T. As such, the top portion 131T and the bottom portions 131B may remain as a contact etch stop layer (CESL) 131T, 131B that protects the source/drain region 82 and the fin 32 in subsequent processes. In some embodiments, thickness of the etch stop layer 131 is in a range of about 1 nm to about 5 nm.

Figure 8K:
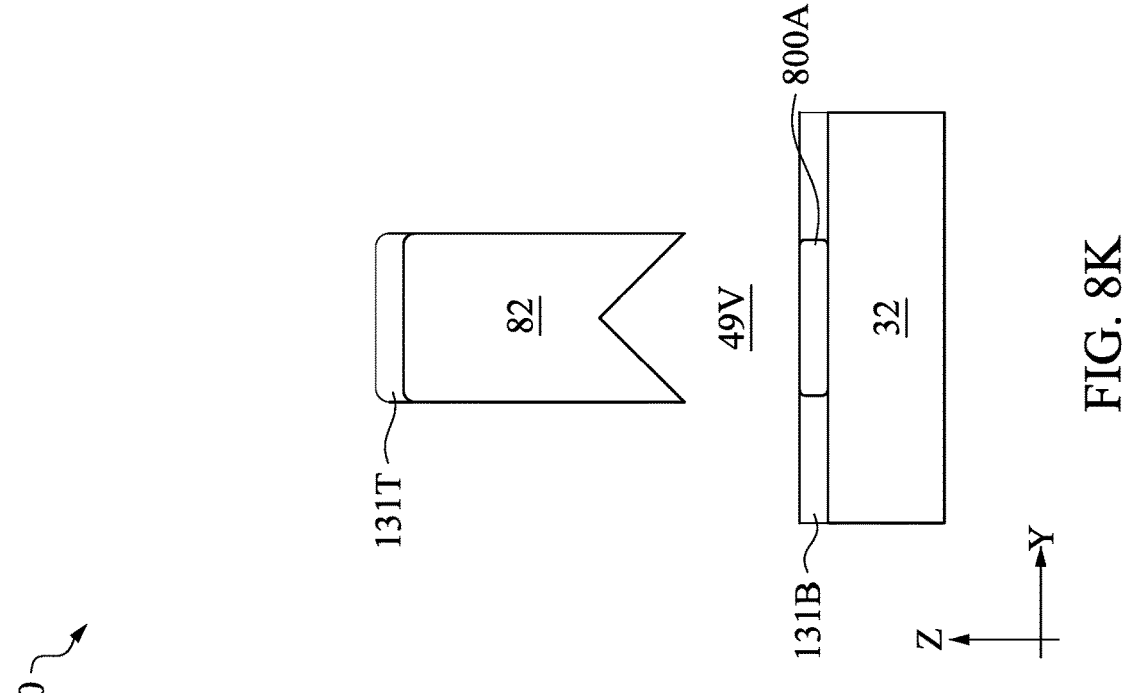
Figure 8J:
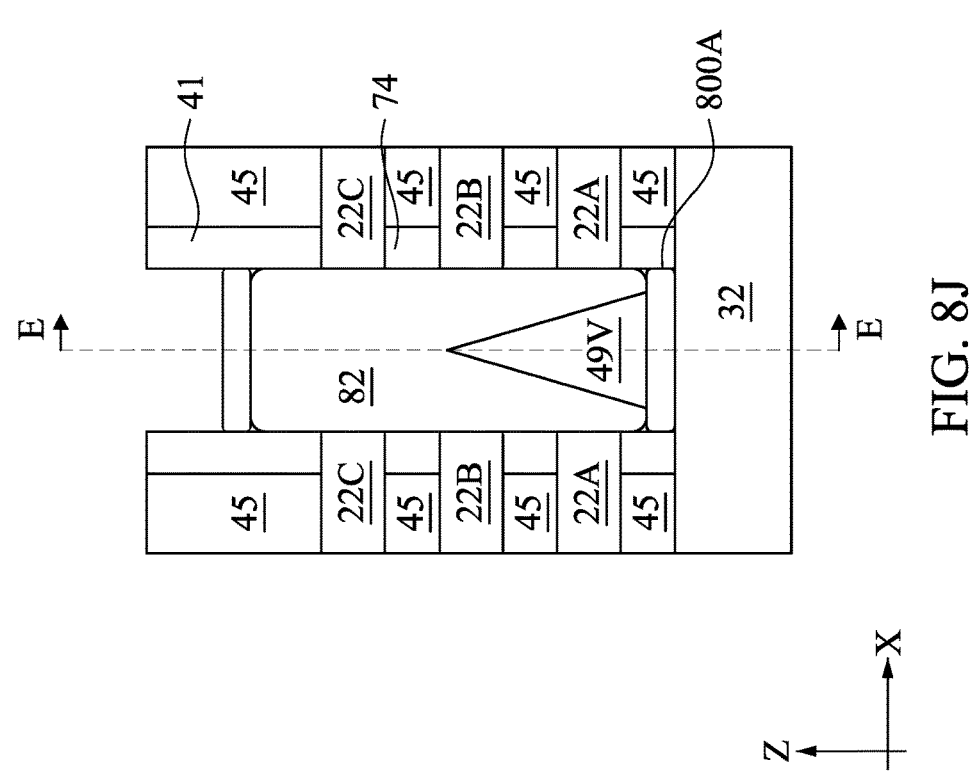

In FIGS. 8J and 8K, following the plasma treatment of FIGS. 8H and 8I, the sidewall portion 131S and the void portion 131V are removed without substantially removing the top portion 131T and the bottom portions 131B, corresponding to operation 2000 of FIG. 13. The removal may include one or more etch operations, such as a wet etch, resulting in the structure depicted in FIGS. 8J and 8K.

Figure 8M:
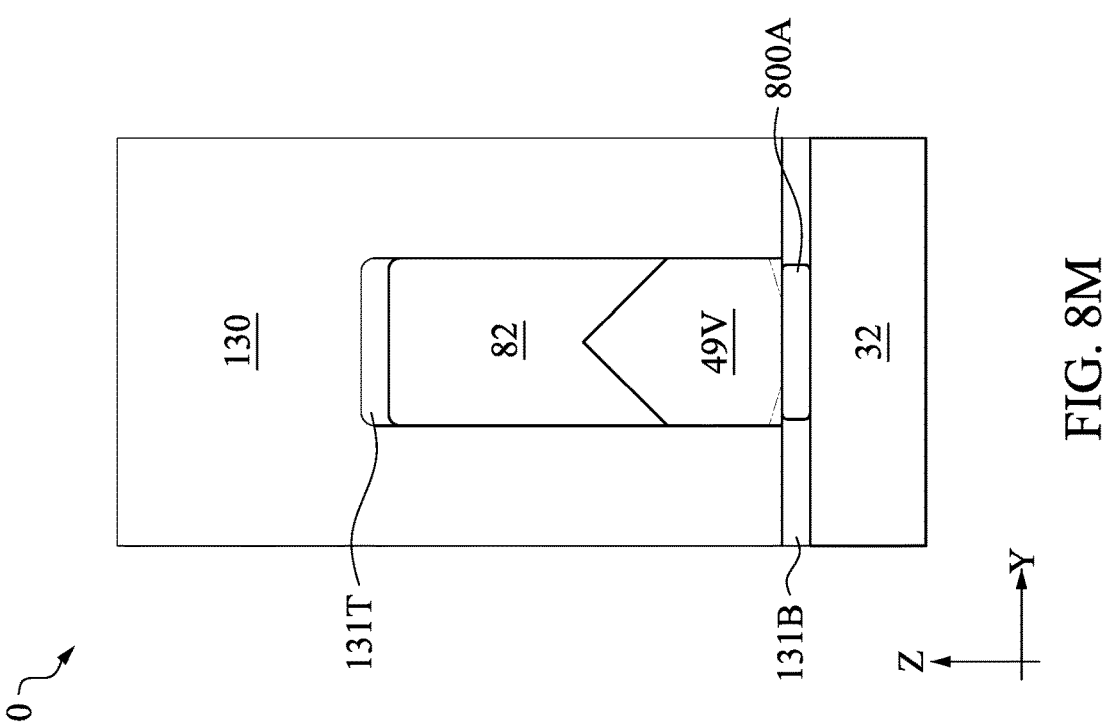
Figure 8L:
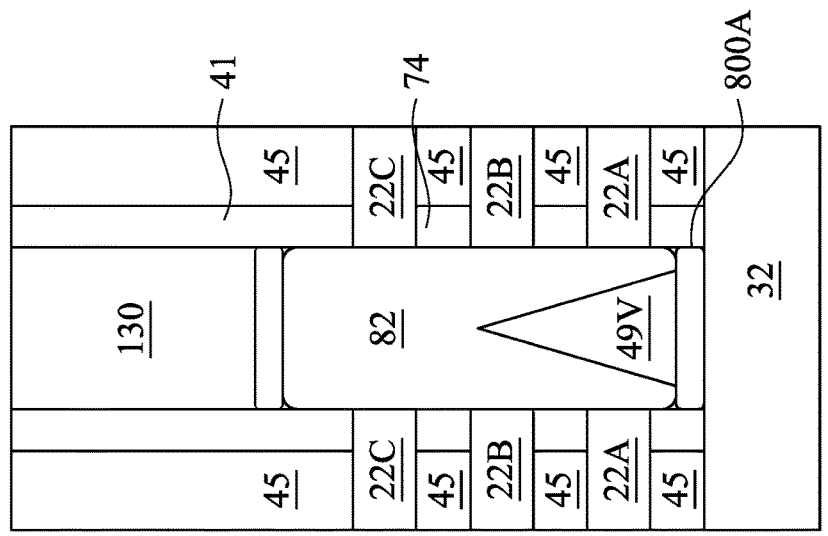

In FIGS. 8L and 8M, following removal of the sidewall portion 131S and the void portion 131V of the dielectric layer 131, an ILD 130 is formed between the sacrificial gate layers 45 on the source/drain region 82 and the fin 32 with the dielectric layer 131 therebetween. In some embodiments, the ILD 130 may be or include silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. The ILD 130 may be formed by a suitable deposition operation, such as a PVD, CVD or ALD. In some embodiments, the ILD 130 is formed by CVD and is deposited at a relatively high deposition rate to avoid the ILD 130 filling the void 49V. For example, the ILD 130 may be formed by a CVD having directionality in the Z-axis direction, such that the void 49V is protected by the source/drain region 82 and the top portion 131T. In some embodiments, some material of the ILD 130 may be deposited on the bottom dielectric layer 800A beneath the source/drain region 82 in the void 49V, which is depicted in FIG. 8M by dot-dashed lines. In some embodiments, the ILD 130 occupies less than 50% of volume of the void 49V, less than 20% of volume of the void 49V, less than 10% of volume of the void 49V or less than 5% of volume of the void. In some embodiments, the ILD 130 occupies a percentage of volume of the void 49V that is in a range of 0% to about 5%. The ILD 130 occupying a smaller percentage of volume of the void 49V increases process window for forming the source/drain contact 120 in the void 49V so as to wrap around the source/drain region 82.

Figure 9B:
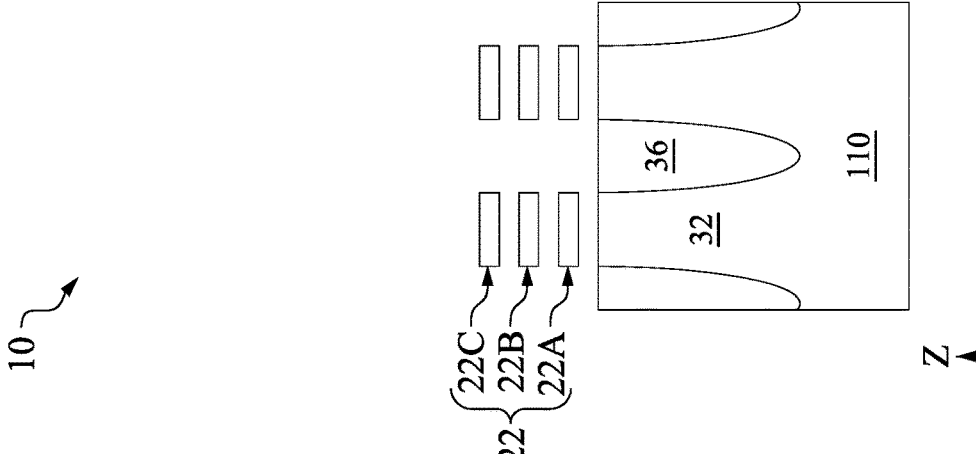
Figure 9A:
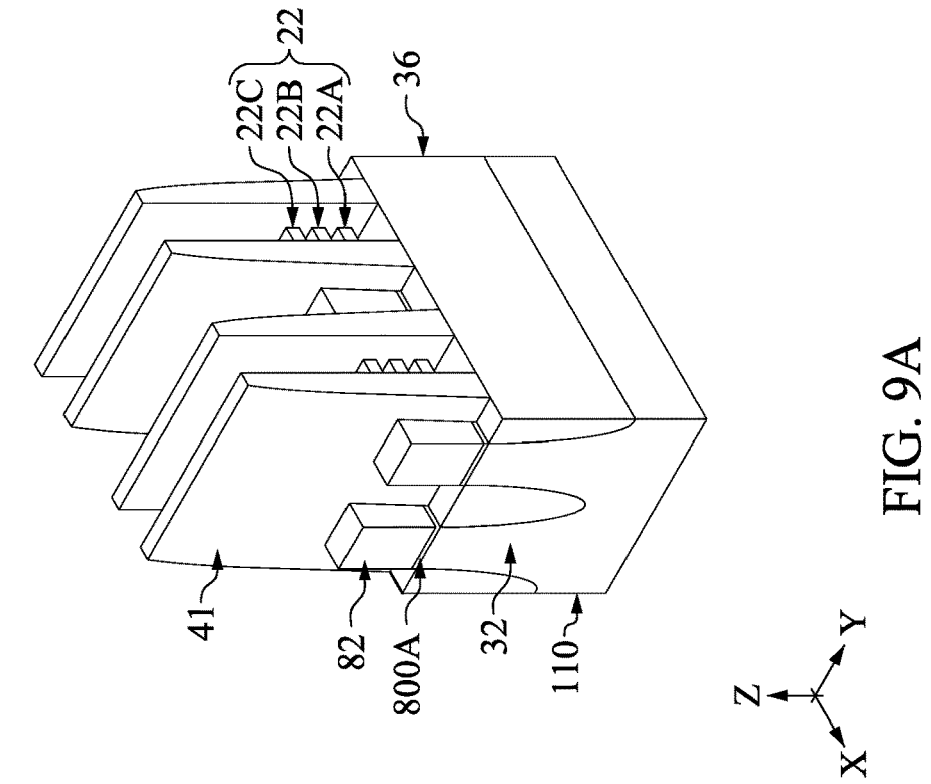
Figure 9C:
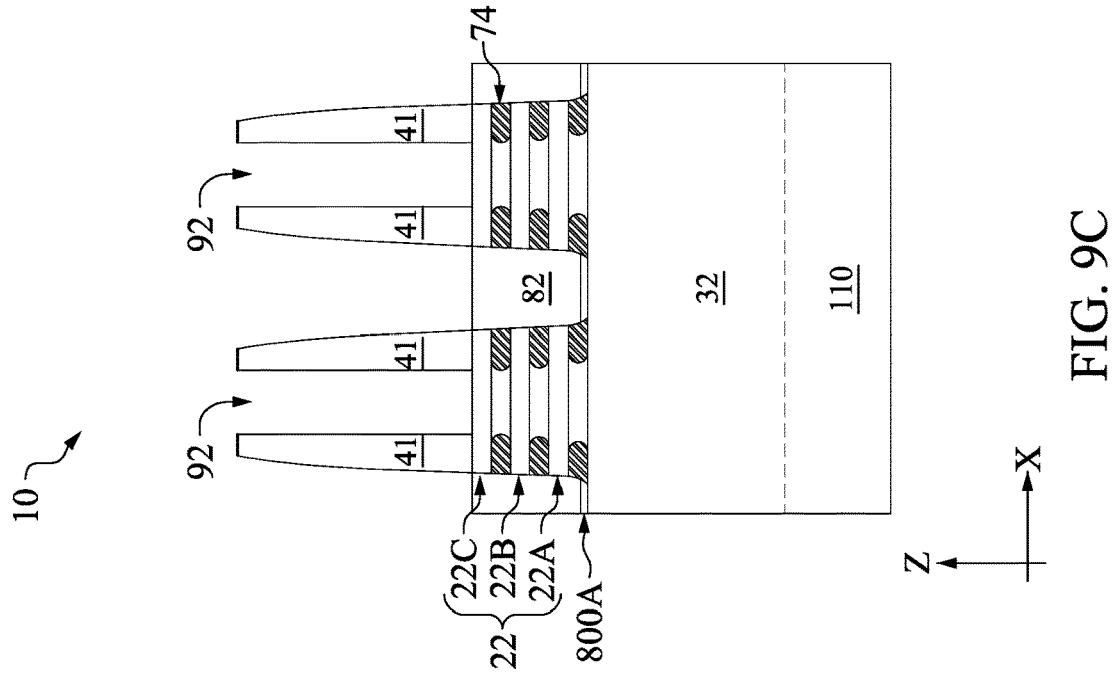

In FIGS. 9A-9C, following formation of the source/drain regions 82, fin channels 22A-22C are released by removal of the nanostructures 24, the mask layer 47, and the sacrificial gate layer 45. A planarization process, such as a CMP, is performed to level the top surfaces of the sacrificial gate layer 45 and gate spacer layer 41. The planarization process may also remove the mask layer 47 on the sacrificial gate layer 45, and portions of the gate spacer layer 41 along sidewalls of the mask layer 47. Accordingly, the top surfaces of the sacrificial gate layer 45 are exposed.

Next, the sacrificial gate layer 45 is removed in an etching process, so that recesses 92 are formed. In some embodiments, the sacrificial gate layer 45 is removed by an anisotropic dry etch process. For example, the etching process may include a dry etch process using reaction gas(es) that selectively etch the sacrificial gate layer 45 without etching the spacer layer 41. The sacrificial gate dielectric, when present, may be used as an etch stop layer when the sacrificial gate layer 45 is etched. The sacrificial gate dielectric may then be removed after the removal of the sacrificial gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110) and are stacked vertically. The nanosheets may be collectively referred to as the channels 22 of a nanostructure device, such as a nanosheet FET (NSFET), which may be a GAAFET.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of a first nanostructure device, and nanostructures 22 may be removed and the nanostructures 24 may be patterned to form channel regions of a second nanostructure device. In some embodiments, the nanostructures 22 may be removed and the nanostructures 24 may be patterned to form channel regions of a first nanostructure device, and the nanostructures 24 may be removed and the nanostructures 22 may be patterned to form channel regions of a second nanostructure device. In some embodiments, the nanostructures 22 may be removed and the nanostructures 24 may be patterned to form channel regions of both PFETs and NFETs.

In some embodiments, the nanosheets 22 of the nanostructure devices are reshaped (e.g., thinned) by a further etching process to improve gate fill window. The reshaping may be performed by an isotropic etching process selective to the nanosheets 22. After reshaping, the nanosheets 22 may exhibit a dog bone shape in which middle portions of the nanosheets 22 are thinner than peripheral portions of the nanosheets 22 along the X direction.

Figure 10A:
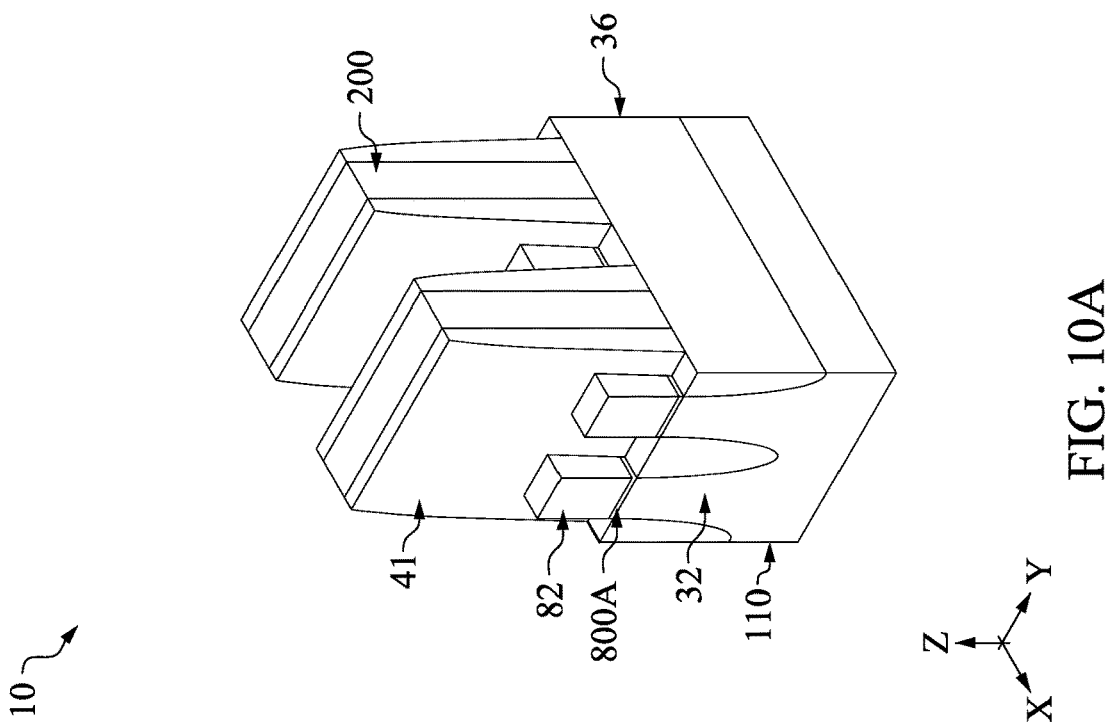
Figure 10C:
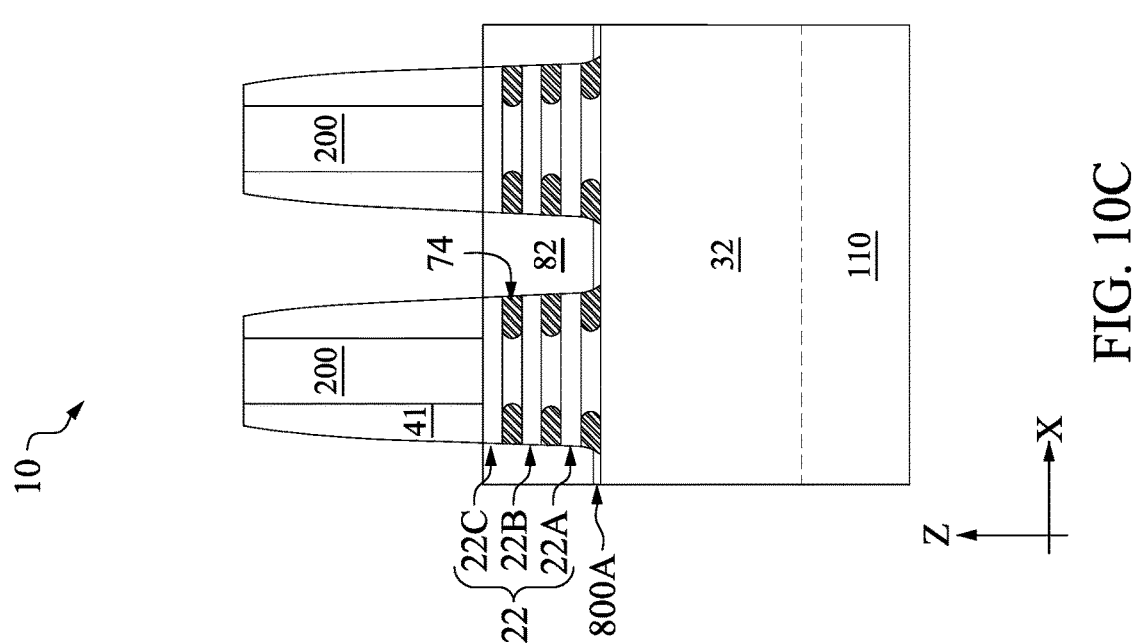
Figure 10B:
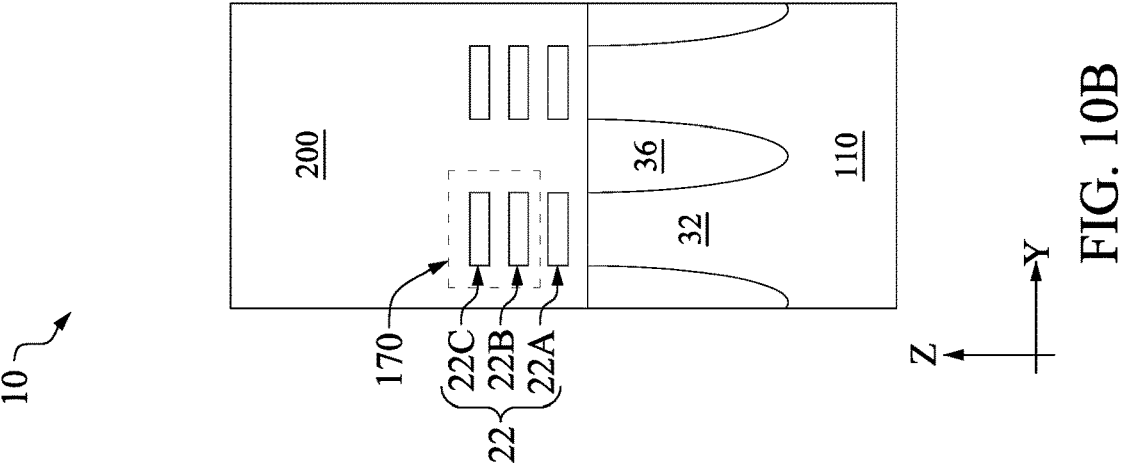

Next, in FIGS. 10A-10C, replacement gates 200, such as the gate structure 200, are formed, corresponding to act 2100 of FIG. 13. Each replacement gate 200 generally includes an interfacial layer (IL) 210, a gate dielectric layer 600 and a gate fill layer 290 (see FIG. 12). In some embodiments, the replacement gate 200 further includes work function metal layers. Formation of the gate structures 200 is described in greater detail with reference to FIG. 12.

Figure 11A:
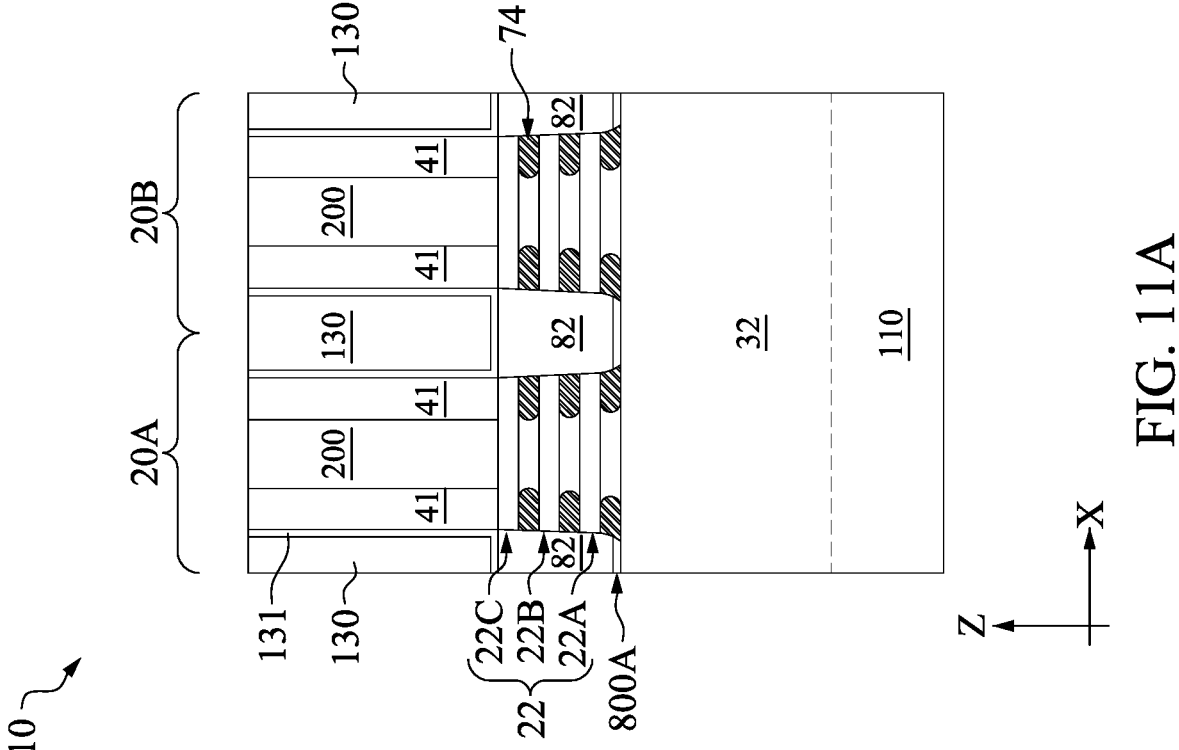

FIG. 11A shows the semiconductor device including an interlayer dielectric (ILD) 130. The ILD 130 provides electrical isolation between the various components of the semiconductor device discussed above, for example between the gate structure 200 and a subsequently formed source/drain contact. In some embodiments, insulating materials that form the ILD 130 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric material used to form the ILD 130 may be deposited using any suitable method, such as CVD, physical vapor deposition (PVD), ALD, PEALD, PECVD, SACVD, FCVD, spin-on, and/or the like, or a combination thereof.

In FIGS. 11B-11H, a source/drain contact 120 is formed that wraps around the source/drain region 82. Forming the source/drain contact 120 that wraps around the source/drain region 82, such that conductive material of the source/drain contact 120 is in contact with the source/drain region 82 on at least three sides (e.g., on four sides), is beneficial to reduce parasitic resistance and improve duty cycle ratio (DC %) of devices including the source/drain region 82.

Figure 11C:
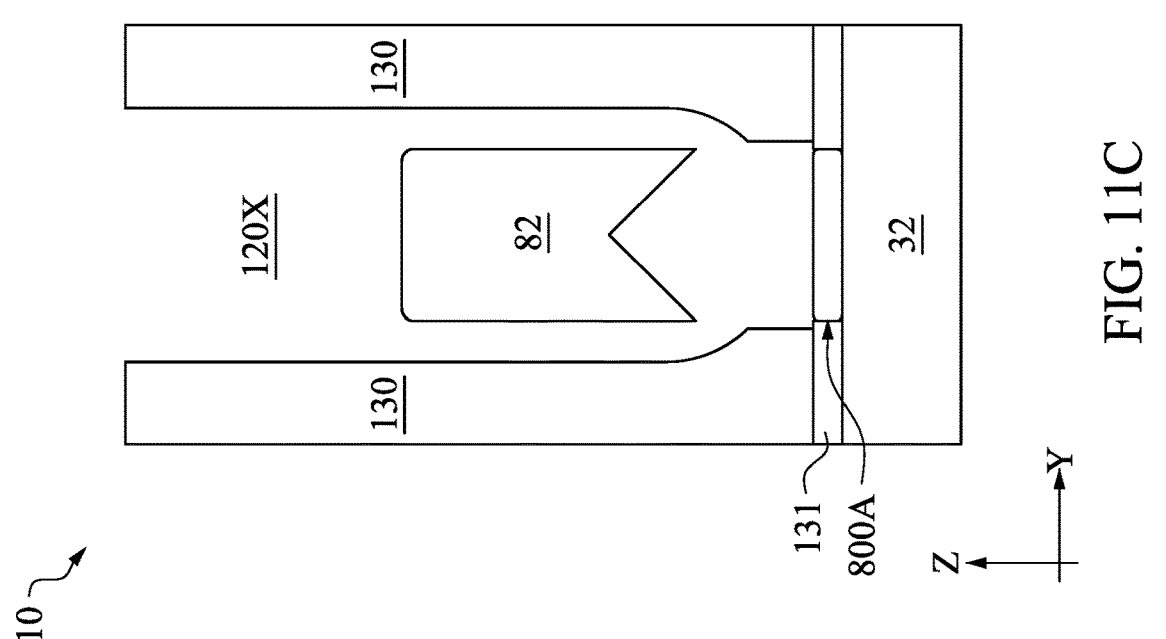
Figure 11B:
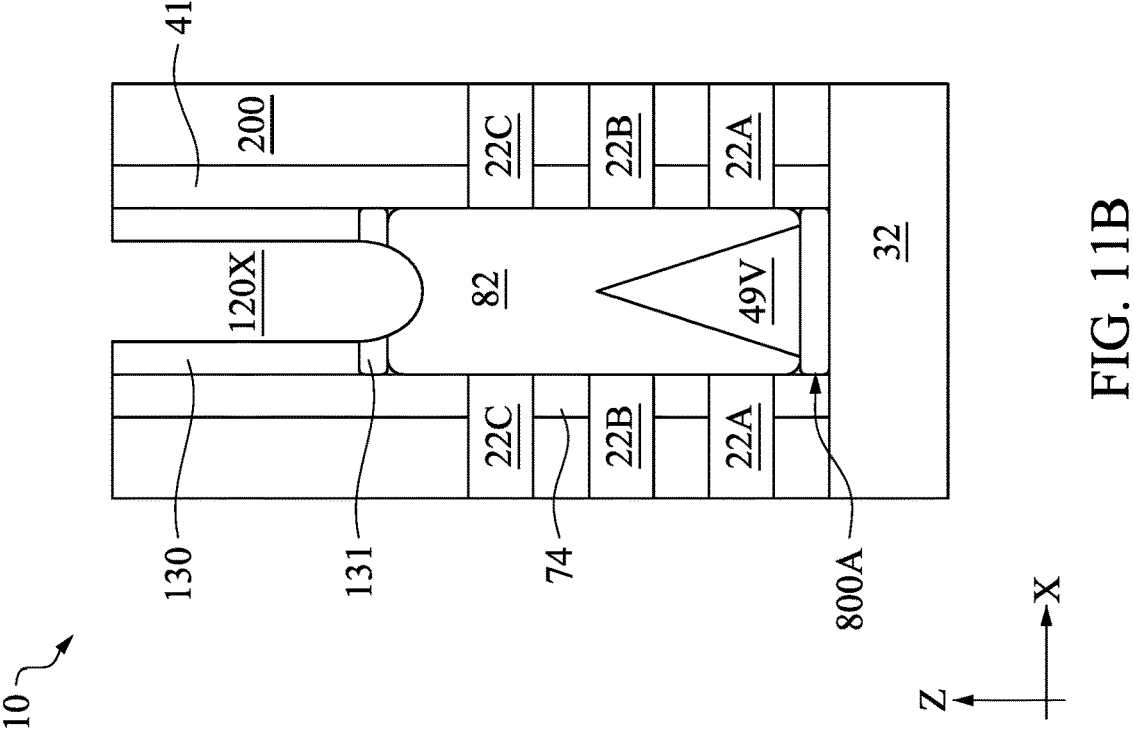

In FIGS. 11B and 11C, following formation of the ILD 130 and the replacement gates 200, a source/drain contact opening 120X is formed, corresponding to act 2200 of FIG. 13. The source/drain contact opening 120X is formed through the ILD 130 and the CESL 131. As shown in FIG. 11B, the source/drain contact opening 120X may not remove the ILD 130 and the CESL 131 entirely in the X-Z plane. For example, width of the source/drain contact opening 120X in the X-axis direction may be less than width of the source/drain region 82. The source/drain contact opening 120X connects to the void 49V, as depicted in FIG. 11C. For example, portions of the source/drain contact opening 120X extend along sidewalls of the source/drain region 82 to a level below an interface between the source/drain region 82 and the void 49V. Because the CESL 131 was removed from the sidewalls of the source/drain region 82, the source/drain contact opening 120X may expose the sidewalls of the source/drain region 82. As such, a source/drain contact 120 formed in a later operation may be in contact with the sidewalls of the source/drain region 82 and a bottom surface of the source/drain region 82 exposed by the void 49V.

Formation of the source/drain contact opening 120X may include a first anisotropic etch (e.g., RIE, plasma etching or the like) that removes material of the ILD 130 without substantially attacking the source/drain region 82. The anisotropic etch may stop on and/or expose the CESL 131 on top of the source/drain region 82. Then, following the first anisotropic etch, another etch operation may be performed to break through the CESL 131, which may be a second anisotropic etch that removes material of the CESL 131 without substantially attacking material of the ILD 130. As depicted in FIG. 11B, following the second anisotropic etch, an upper surface of the source/drain region 82 may be recessed slightly, and may have a concave shape in the X-Z plane. In some embodiments, following the etch process(es) that forms the source/drain contact opening 120X, the source/drain contact opening 120X may not be connected to the void 49V. For example, the source/drain contact opening 120X may be formed to a level that is above the interface between the source/drain region 82 and the void 49V, such that the source/drain contact opening 120X is separated from the void 49V by the ILD 130. In such embodiments, the source/drain contact 120 later formed may wrap around the source/drain region 82 on three sides in the Y-Z plane.

FIGS. 11D, 11E, 11F and 11G illustrate formation of the source/drain contacts 120 in accordance with various embodiments. The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. The source/drain contacts 120 may be surrounded by barrier or liner layers 120L, such as TiN, TiSi, TiSiN or the like, which help prevent or reduce diffusion of materials from and into the contacts 120. A silicide layer (not separately depicted) may also be formed between the source/drain features 82 and the source/drain contacts 120, so as to reduce source/drain contact resistance. The silicide layer may include nickel, cobalt, titanium, tantalum, platinum, tungsten, other noble metals, other refractory metals, rare earth metals or their alloys. In some embodiments, thickness of the silicide layer (in the Z-axis direction) is in a range of about 0.5 nm to about 5 nm. In some embodiments, height of the source/drain contacts 120 may be in a range of about 1 nm to about 50 nm. In some embodiments, spacer layers 120S are formed in the source/drain contact opening 120X on sidewalls of the ILD 130. The spacer layers 120S may be or include a dielectric layer, such as SiN, SiCN, SiOCN, SiON, or the like. Formation of the spacer layers 120S may include one or more suitable deposition operations, such as a PVD, CVD, ALD or the like.

Figure 11E:
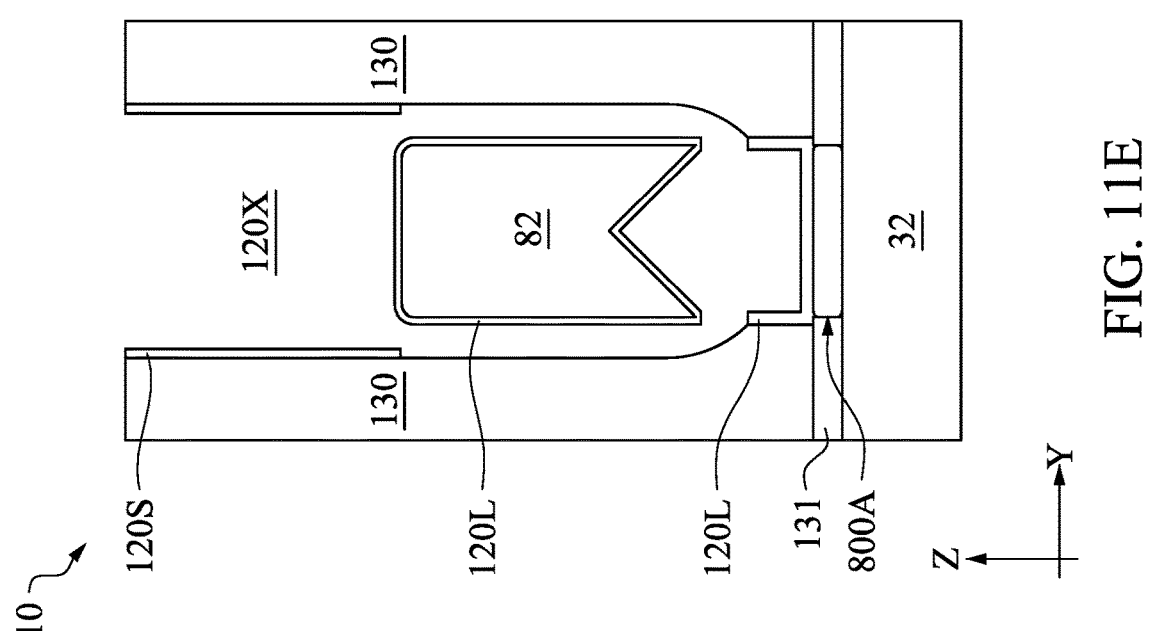
Figure 11D:
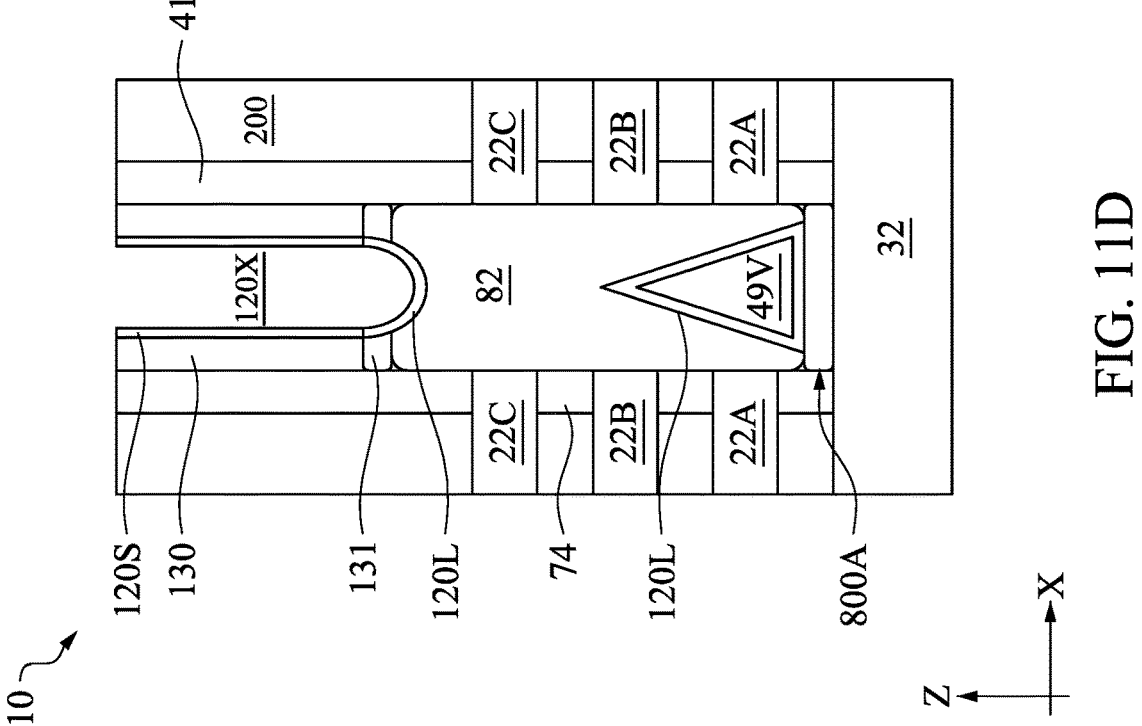

In FIGS. 11D and 11E, the liner layer 120L is formed, corresponding to act 2300 of FIG. 13. The liner layer 120L may be or include a silicide, such as TiSi or another of the silicide materials just described. In some embodiments, the liner layer 120L is or includes a conductive nitride, such as TiN, TiSiN or the like. The liner layer 120L may be a multilayer that includes one or more silicides and one or more conductive nitrides. The liner layer 120L may be formed on exposed surfaces of the source/drain region 82, including the upper surface of the source/drain region 82, the sidewalls of the source/drain region 82 and the bottom surface of the source/drain region 82 exposed by the void 49V. In FIG. 11D, the liner layer 120L is depicted as being formed on the upper surface of the bottom dielectric layer 800A and on sidewalls of the ILD 130 directly above the bottom dielectric layer 800A. In some embodiments, the liner layer 120L is not present on the bottom dielectric layer 800A or the ILD 130 and/or has a different material composition on the upper surface of the bottom dielectric layer 800A and the ILD 130 than on the source/drain region 82. Namely, the liner layer 120L may only be present on exposed surfaces of the source/drain region 82 and may be in direct contact with the source/drain region 82. The liner layer 120L may be formed by one or more deposition operations, such as a PVD, CVD, ALD or the like, and may further be formed by a suitable anneal operation, such as when forming a silicide as just described. In some embodiments, formation of the liner layer 120L is optional. Namely, the liner layer 120L is not present in some embodiments.

Figure 11G:
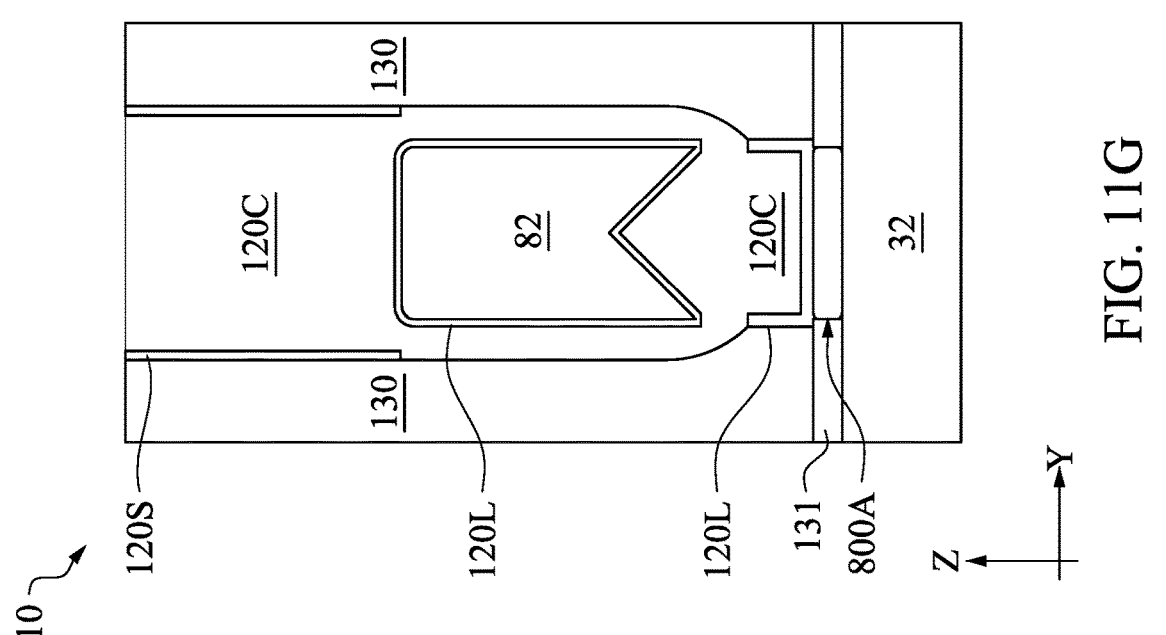
Figure 11F:
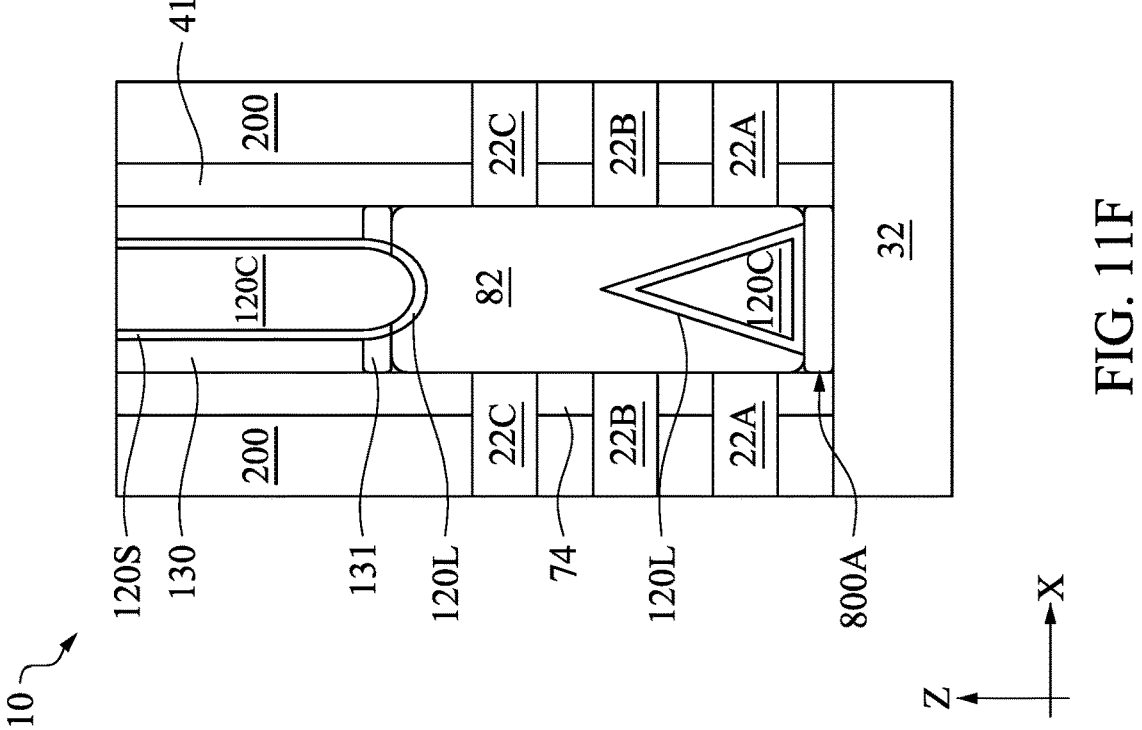
Figure 11I:
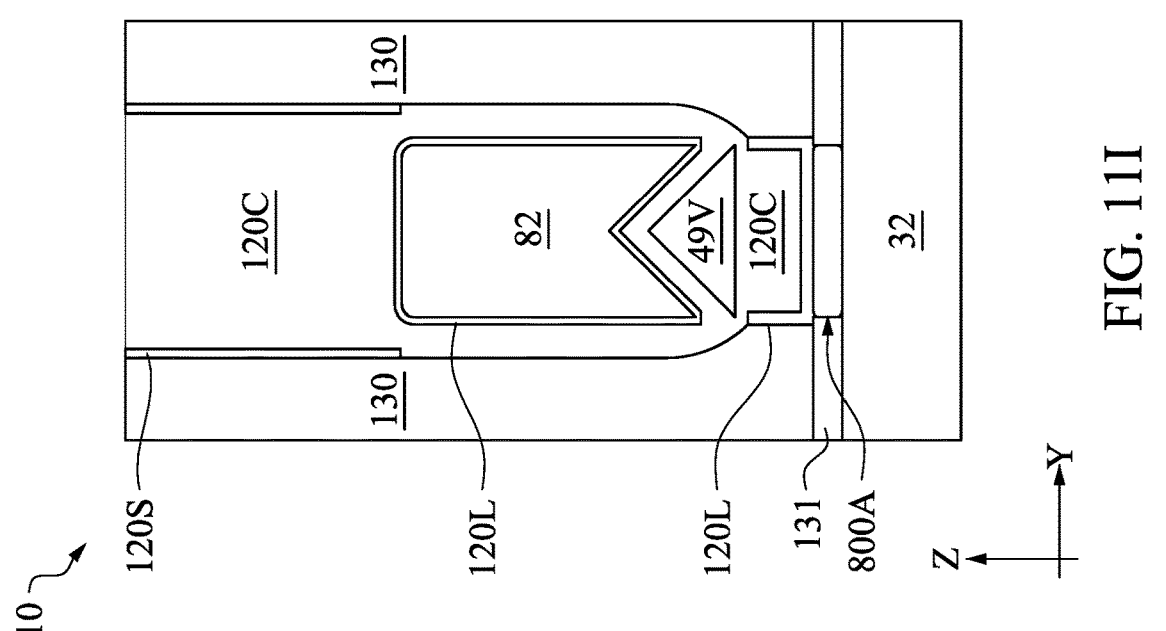
Figure 11H:
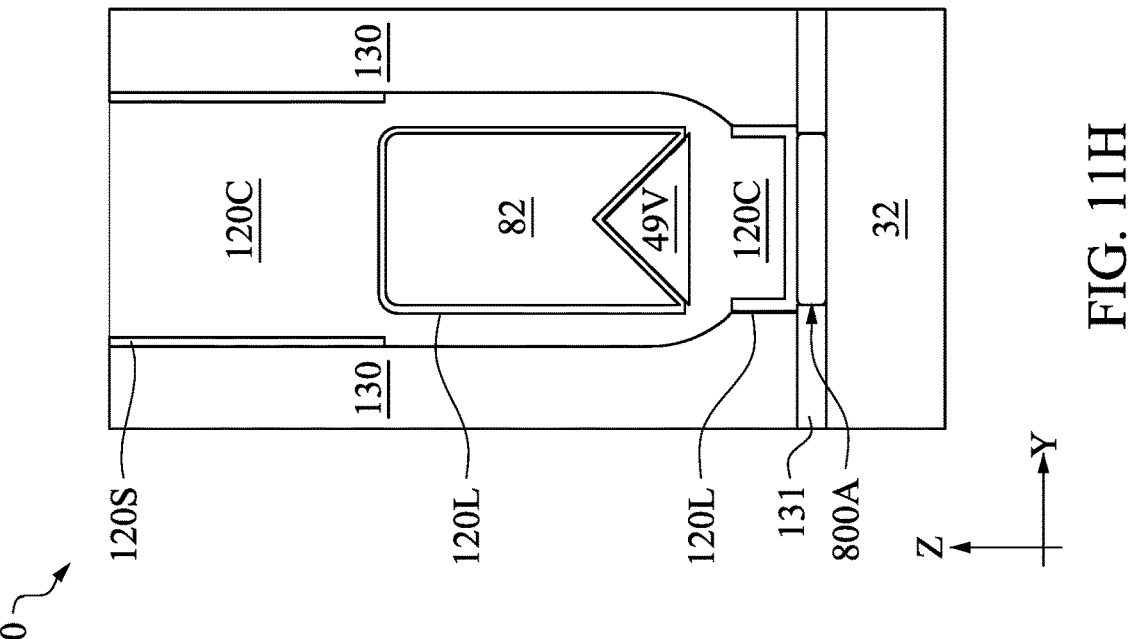

In FIGS. 11F and 11G, following formation of the liner layer 120L, a conductive core layer 120C is formed, corresponding to act 2400 of FIG. 13. The conductive core layer 120C may be a different material than the liner layer 120L, such as tungsten, ruthenium, cobalt, copper, titanium, titanium nitride, tantalum, tantalum nitride, iridium, molybdenum, nickel, aluminum, or combinations thereof. In some embodiments, the conductive core layer 120C is cobalt. In some embodiments, the conductive core layer 120C is deposited in the source/drain contact opening 120X by PVD, CVD, ALD or the like. The conductive core layer 120C may inherit the shape of the source/drain contact opening 120X. The conductive core layer 120C may fill remaining portions of the source/drain contact opening 120X entirely or partially. For example, as depicted in FIG. 11G, the conductive core layer 120C may fill the void 49V entirely, such that the conductive core layer 120C is in direct contact with the liner layer 120L (when present) in the void 49V or with the bottom surface of the source/drain region 82 exposed by the void 49V (e.g., when the liner layer 120L is not present).

In some embodiments, a portion of the conductive core layer 120C in the void 49V may partially fill the void 49V. This is depicted diagrammatically in FIG. 11H. In such embodiments, the conductive core layer 120C may not be in contact with the bottom surface of the source/drain region 82 and/or the liner layer 120L, but instead may be separated from the bottom surface of the source/drain region 82 by the void 49V. In some embodiments, a portion of the void 49V may be present after deposition of the conductive core layer 120C and the conductive core layer 120C may be in direct contact with the bottom surface of the source/drain region 82 and/or the liner layer 120L. This is depicted diagrammatically in FIG. 11I. In some embodiments, thickness of the conductive core layer 120C on the bottom surface of the source/drain region 82 and/or the liner layer 120L is in a range of about 1 nm to about 5 nm or more. The conductive core layer 120C being in contact with the bottom surface of the source/drain region 82 and/or the liner layer 120L and having thickness above about 1 nm is beneficial to reduce parasitic resistance of the source/drain contact 120.

Figure 11J:
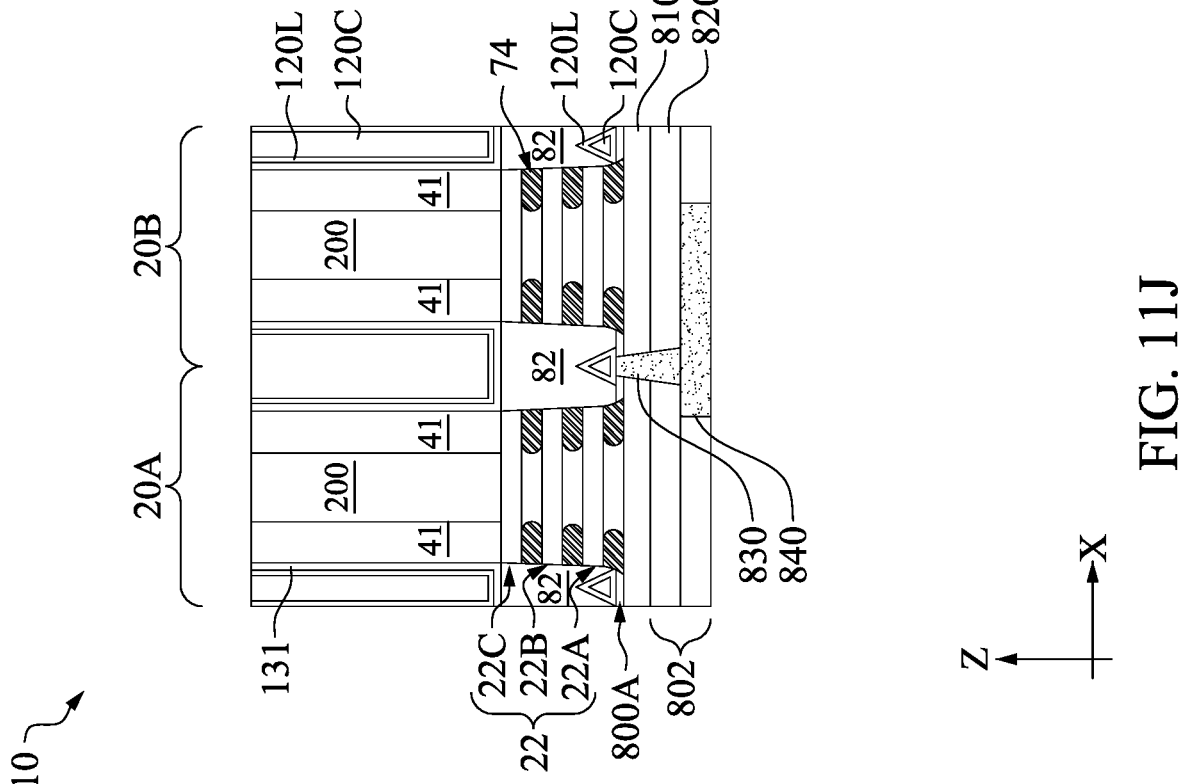

FIG. 11J shows the semiconductor device including backside interconnect structure 802 in accordance with various embodiments. Frontside interconnect features are omitted from view in FIG. 11J for clarity of illustration. In some embodiments, following formation of frontside interconnect features, the substrate 110 is thinned or removed, and the fins 32 are thinned or removed. Following thinning of the substrate 110, and optionally the fins 32, the backside interconnect structure 802 is formed. A first backside ILD 810 may be formed on the backside of the semiconductor device. Materials and formation processes may be similar to those described with reference to the ILD 130. Then, a first removal operation, such as an etching operation, may be performed to pattern the first backside ILD 810 and optionally the fins 32 to form first openings that expose one or more of the source/drain regions 82. A first backside via or contact 830 is formed in one of the openings and is electrically coupled to the backside of the source/drain region 82. In some embodiments, the first backside via 830 is in contact with the liner layer 120L, the conductive core layer 120C or the source/drain region 82. A second backside ILD 820 is formed on the first backside ILD 810. Materials and formation processes may be similar to those described with reference to the ILD 130. Second openings are formed in the second backside ILD 820 by a second removal process, such as a second etching operation, that patterns the second backside ILD 820. A first backside trace or wire 840 is formed in the second opening. Formation of the first backside contact 830 may be similar in many respects to formation of the contacts 120.

Figure 12:
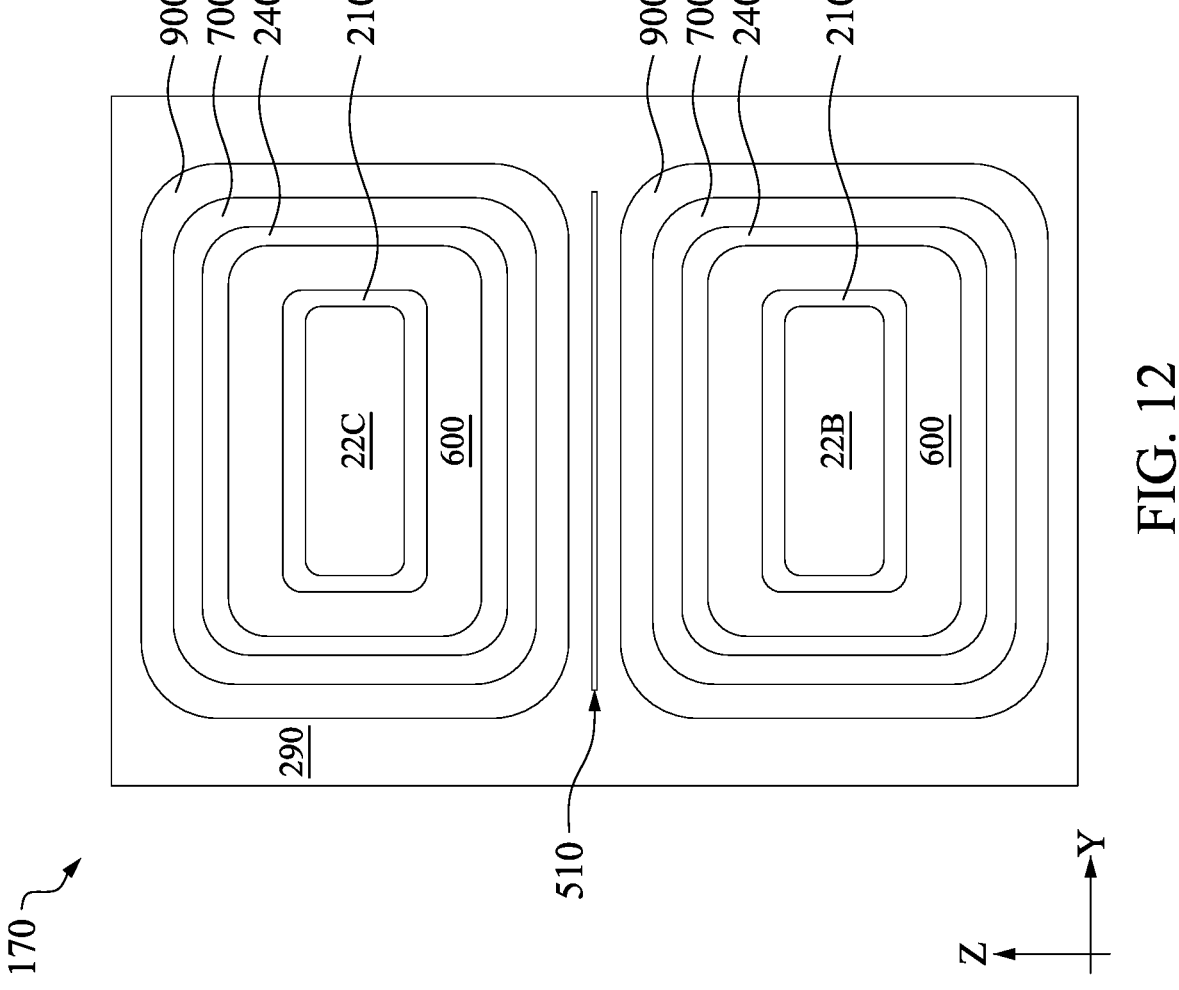
Figure 13:
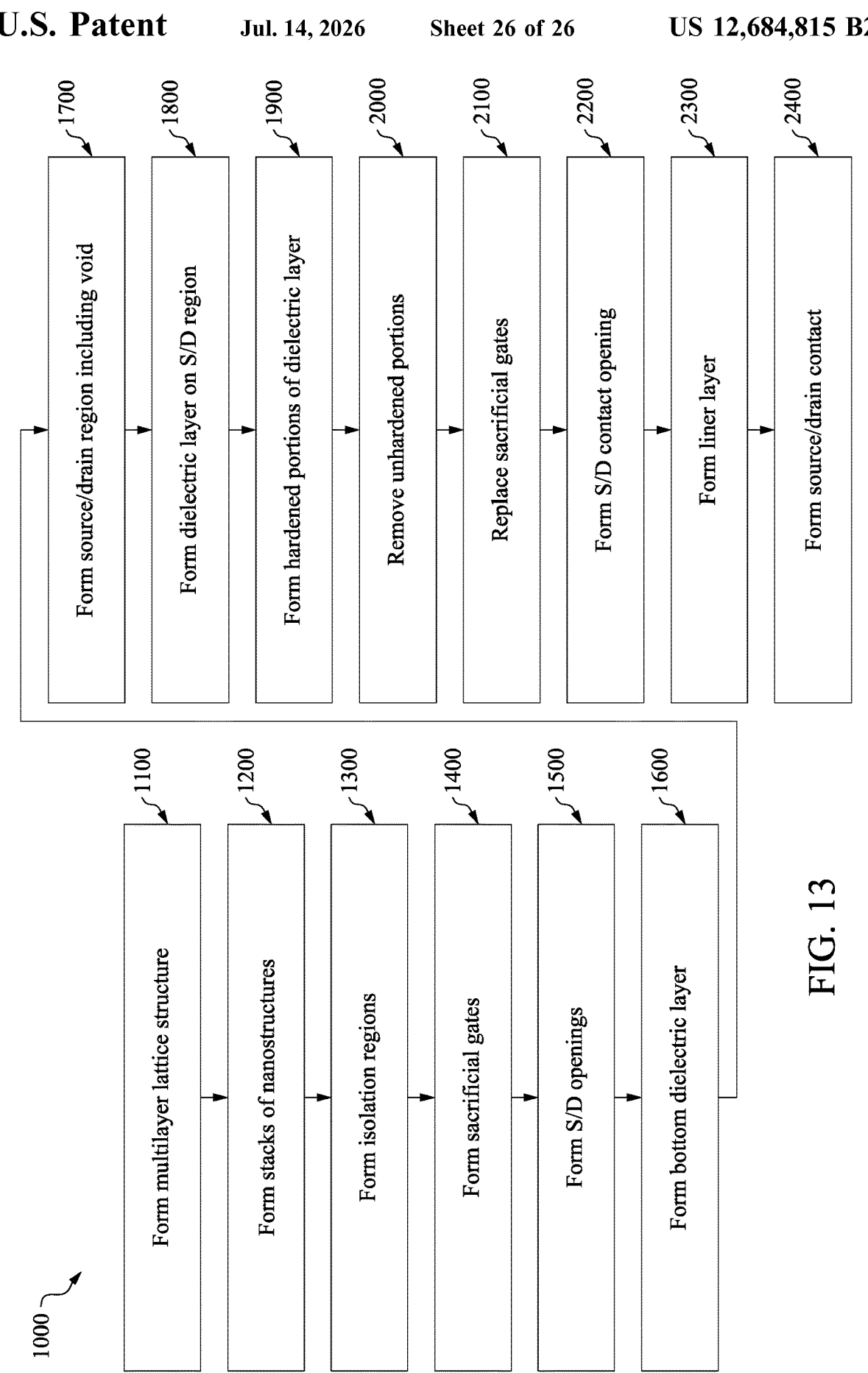
FIG. 13 is a flowchart illustrating a method of fabricating a semiconductor device according to various aspects of the present disclosure.

FIG. 12 is a diagrammatic cross-sectional side view of a region 170 of FIG. 10B in accordance with various embodiments. The gate structure 200 is disposed over and between the channels 22A-22C, respectively. The gate structure 200 may wrap around each of the channels 22A-22C. In some embodiments, the gate structure 200 is disposed over and between the channels 22A-22C, which may be silicon channels for N-type devices or silicon germanium channels for P-type devices, or may be silicon channels for both N-type and P-type devices. In some embodiments, the gate structure 200 includes the interfacial layer (IL) 210, one or more gate dielectric layers 600, one or more work function tuning layers 900, and a metal fill layer 290.

The interfacial layer 210, which may be an oxide of the material of the channels 22A-22C, is formed on exposed areas of the channels 22A-22C and the top surface of the fin 32. The interfacial layer 210 promotes adhesion of the gate dielectric layers 600 to the channels 22A-22C. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

The gate dielectric layer 600 may be formed on the IL 210. In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include HfO2, HfSiO, HfSiON, HfTaO, HfTiO, HfZrO, ZrO2, Ta2O5, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from La2O3, MgO, Y2O3, TiO2, Al2O3, Nb2O5, or the like, or boron ions driven in from B2O3, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

In some embodiments, the gate structure 200 further includes one or more work function metal layers, represented collectively as work function metal layer 900. When configured as an NFET, the work function metal layer 900 of the GAA device 20 may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200 also includes metal fill layer 290. The metal fill layer 290 may include a conductive material such as tungsten, cobalt, ruthenium, iridium, molybdenum, copper, aluminum, or combinations thereof. Between channels 22A-22C, the metal fill layer 290 is circumferentially surrounded (in the cross-sectional view) by the one or more work function metal layers 900, which are then circumferentially surrounded by the gate dielectric layers 600, which are circumferentially surrounded by the interfacial layer 210. The gate structure 200 may also include a glue layer that is formed between the one or more work function layers 900 and the metal fill layer 290 to increase adhesion.

The glue layer is not specifically illustrated in FIG. 12 for simplicity. In some embodiments, a conductive layer is formed over the gate structure 200 and is in contact with the metal fill layer 290, the one or more work function layers 900 and the gate dielectric layers 600. The conductive layer may include fluorine-free tungsten (FFW) or another suitable material. In some embodiments, a dielectric capping layer is present over the conductive layer.

Additional processing may be performed following fabrication of the semiconductor device. For example, gate contacts may be formed that electrically couple to the gate structure 200, and source/drain vias may be formed that electrically couple to the source/drain contacts 120. An interconnect structure (e.g., a "frontside interconnect structure") may then be formed over the source/drain contacts 120 and the gate contacts. The interconnect structure may include a plurality of interconnect layers, each of which may include one or more dielectric layers with metallic features embedded therein, such as conductive traces and conductive vias, which form electrical connection between devices of the IC chip 10. In some embodiments, a conductive layer or conductive cap is present over the gate structure 200. In some embodiments, dielectric capping layers are present over the gate structure 200 and/or over the source/drain contacts 120. Configurations in which the dielectric capping layers are only present over the gate structure 200 (e.g., no second capping layers are present over the source/drain contacts 120) may be referred to as "single SAC" structures, and configurations in which the capping layers are present over gate structures 200 and source/drain contacts 120 may be referred to as "double SAC" structures.

Embodiments may provide advantages. The source/drain contact 120 is formed to wrap around the source/drain region 82. The source/drain contact 120 wrapping around the source/drain region 82 is beneficial to reduce parasitic resistance, which improves duty cycle ratio performance.

In accordance with at least one embodiment, a method includes: forming a stack of semiconductor nanostructures on a semiconductor fin; forming a source/drain opening adjacent the stack; forming a bottom dielectric layer on the semiconductor fin; forming a source/drain region in the source/drain opening, a void being present between the source/drain region and the bottom dielectric layer; forming a dielectric layer on the source/drain region; forming a hardened portion of the dielectric layer by treating the dielectric layer, the hardened portion having higher etch selectivity than other portions of the dielectric layer; removing the other portions of the dielectric layer, exposing the void; forming a source/drain contact opening that extends to and connects with the void, the source/drain contact opening exposing sidewalls of the source/drain region; forming a liner layer on exposed surfaces of the source/drain region; and forming a conductive core layer on the liner layer, the conductive core layer being in contact with the liner layer on a top surface, sidewalls and a bottom surface of the source/drain region.

In accordance with at least one embodiment, a method includes: forming a stack of semiconductor nanosheet channels on a semiconductor fin; forming a source/drain opening adjacent the stack; forming a source/drain region in the source/drain opening, a void being present between the source/drain region and the semiconductor fin; forming a dielectric layer on the source/drain region and in the void; exposing the void by removing portions of the dielectric layer on sidewalls of the source/drain region and in the void; forming an interlayer dielectric on the source/drain region and the dielectric layer; forming a source/drain contact opening that extends through the interlayer dielectric and connects with the void, the source/drain contact opening exposing sidewalls of the source/drain region; and forming a conductive core layer in contact with a top surface and sidewalls of the source/drain region.

In accordance with at least one embodiment, a device includes: a stack of semiconductor nanostructures; a source/drain region adjacent the stack, the source/drain region having a top surface, sidewalls and a bottom surface; a bottom dielectric layer underlying the source/drain region; a source/drain contact that is in contact with the top surface and the sidewalls of the source/drain region and is between an upper surface of the bottom dielectric layer and the source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a stack of semiconductor nanostructures on a semiconductor fin;
forming a source/drain opening adjacent the stack;
forming a bottom dielectric layer on the semiconductor fin;
forming a source/drain region in the source/drain opening, a void being present between the source/drain region and the bottom dielectric layer;
forming a dielectric layer on the source/drain region;
forming a hardened portion of the dielectric layer by treating the dielectric layer, the hardened portion having higher etch selectivity than other portions of the dielectric layer;
removing the other portions of the dielectric layer, exposing the void;
forming a source/drain contact opening that extends to and connects with the void, the source/drain contact opening exposing sidewalls of the source/drain region;
forming a liner layer on exposed surfaces of the source/drain region; and
forming a conductive core layer on the liner layer, the conductive core layer being in contact with the liner layer on a top surface, sidewalls and a bottom surface of the source/drain region.

2. The method of claim 1, wherein the void has width in a horizontal direction in a range of about 10 nanometers to about 15 nanometers.

3. The method of claim 1, wherein the void has height in a vertical direction that is in a range of about 10 nanometers to about half of height of the source/drain region.

4. The method of claim 1, wherein the forming a dielectric layer is forming a dielectric nitride layer.

5. The method of claim 1, wherein the forming a hardened portion includes forming a top portion on an upper surface of the source/drain region and a bottom portion on the semiconductor fin.

6. The method of claim 1, wherein the forming a conductive core layer includes forming the conductive core layer in the void, the conductive core layer including a second void.

7. A method comprising:
forming a stack of semiconductor nanosheet channels on a semiconductor fin;
forming a source/drain opening adjacent the stack;
forming a source/drain region in the source/drain opening, a void being present between the source/drain region and the semiconductor fin;
forming a dielectric layer on the source/drain region and in the void;
exposing the void by removing portions of the dielectric layer on sidewalls of the source/drain region and in the void;
forming an interlayer dielectric on the source/drain region and the dielectric layer;
forming a source/drain contact opening that extends through the interlayer dielectric and connects with the void, the source/drain contact opening exposing sidewalls of the source/drain region; and
forming a conductive core layer in contact with a top surface and sidewalls of the source/drain region.

8. The method of claim 7, wherein the void is present following the forming an interlayer dielectric.

9. The method of claim 7, wherein the void extends from below a first height level with a bottom surface of a first semiconductor nanosheet channel of the stack that is nearest the semiconductor fin to a second height that is between a top surface of the first semiconductor nanosheet channel and an upper surface of a second semiconductor nanosheet channel of the stack that is above the first semiconductor nanosheet channel.

10. The method of claim 7, wherein the forming a conductive core layer includes partially filling the void.

11. The method of claim 10, wherein the conductive core layer is separated from a bottom surface of the source/drain region by an unfilled portion of the void.

12. The method of claim 10, wherein a portion of the conductive core layer in contact with the bottom surface of the source/drain region has thickness in a range of about 1 nanometer to about 5 nanometers.

13. The method of claim 7, further comprising forming a backside via that is in contact with the conductive core layer.

14. A method comprising:
forming a stack of semiconductor nanostructures on a semiconductor fin;
forming a source/drain opening adjacent the stack;
forming a bottom dielectric layer on the semiconductor fin;
forming a source/drain region in the source/drain opening, a void being present between the source/drain region and the bottom dielectric layer;
forming a dielectric layer on the source/drain region and in the void;
forming an interlayer dielectric over the source/drain region and the dielectric layer;
forming a source/drain contact opening through the interlayer dielectric and connecting with the void, the source/drain contact opening exposing sidewalls of the source/drain region; and
forming a conductive core layer in the source/drain contact opening, the conductive core layer being in contact with a top surface and sidewalls of the source/drain region and extending into the void.

15. The method of claim 14, wherein the void has width in a horizontal direction in a range of about 10 nanometers to about 15 nanometers.

16. The method of claim 14, wherein the void has height in a vertical direction that is in a range of about 10 nanometers to about half of height of the source/drain region.

17. The method of claim 14, wherein the dielectric layer comprises a nitride material.

18. The method of claim 14, wherein the forming the dielectric layer includes forming a top portion on an upper surface of the source/drain region and a bottom portion on the semiconductor fin.

19. The method of claim 14, wherein the forming the conductive core layer includes partially filling the void.

20. The method of claim 19, wherein the conductive core layer is separated from a bottom surface of the source/drain region by an unfilled portion of the void.

\* \* \* \* \*